United States Patent
Matsuzaki et al.

(10) Patent No.: US 11,674,217 B2
(45) Date of Patent: Jun. 13, 2023

(54) METHOD OF MANUFACTURING SUBSTRATE WITH A TRANSPARENT CONDUCTIVE FILM, MANUFACTURING APPARATUS OF SUBSTRATE WITH TRANSPARENT CONDUCTIVE FILM, SUBSTRATE WITH TRANSPARENT CONDUCTIVE FILM, AND SOLAR CELL

(71) Applicant: ULVAC, INC., Chigasaki (JP)

(72) Inventors: Junsuke Matsuzaki, Chigasaki (JP); Hirohisa Takahashi, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/070,094

(22) PCT Filed: Mar. 23, 2017

(86) PCT No.: PCT/JP2017/011724
§ 371 (c)(1),
(2) Date: Jul. 13, 2018

(87) PCT Pub. No.: WO2017/170125
PCT Pub. Date: Oct. 5, 2017

(65) Prior Publication Data
US 2020/0168759 A1 May 28, 2020

(30) Foreign Application Priority Data
Mar. 29, 2016 (JP) .............................. JP2016-066579

(51) Int. Cl.
*C23C 14/56* (2006.01)
*C23C 14/18* (2006.01)
(Continued)

(52) U.S. Cl.
CPC ............ *C23C 14/56* (2013.01); *C23C 14/185* (2013.01); *C23C 14/50* (2013.01);
(Continued)

(58) Field of Classification Search
CPC ..... C23C 14/56; C23C 14/566; C23C 14/568; C23C 14/541; C23C 14/086; C23C 14/02;
(Continued)

(56) References Cited

U.S. PATENT DOCUMENTS

| 5,998,730 | A | 12/1999 | Shiozaki et al. |
| 8,083,912 | B2 * | 12/2011 | Klug ................ C23C 14/50 204/298.15 |

(Continued)

FOREIGN PATENT DOCUMENTS

| EP | 2299477 | 3/2011 |
| EP | 2479763 | 7/2012 |

(Continued)

OTHER PUBLICATIONS

Office Action from related Korean Appln. No. 10-2018-7020364, dated Jun. 10, 2019. English translation attached.
(Continued)

*Primary Examiner* — Michael A Band
(74) *Attorney, Agent, or Firm* — Grossman, Tucker, Perreault & Pfleger, PLLC

(57) ABSTRACT

A method of the invention which manufactures a substrate with a transparent conductive film, includes: preparing a base body that has a top surface and a back surface and has an a-Si film coating at least one of the top surface and the back surface; and setting temperatures of the base body and the a-Si film to be in the range of 70 to 220° C. in a film
(Continued)

formation space having a processing gas containing hydrogen, applying a sputtering voltage to a target, carrying out DC sputtering, and thereby forming the a-Si film on a transparent conductive film.

4 Claims, 18 Drawing Sheets

(51) Int. Cl.
    *C23C 14/50*     (2006.01)
    *H01J 37/32*     (2006.01)
    *H01J 37/34*     (2006.01)
    *H01L 21/67*     (2006.01)
    *H01L 21/677*     (2006.01)
    *H01L 31/18*     (2006.01)
    *C23C 14/34*     (2006.01)
    *H01L 31/0224*     (2006.01)
    *H01L 31/0376*     (2006.01)
    *H01L 31/075*     (2012.01)
    *H01L 31/20*     (2006.01)

(52) U.S. Cl.
    CPC .... *H01J 37/32899* (2013.01); *H01J 37/3488* (2013.01); *H01L 21/67173* (2013.01); *H01L 21/67742* (2013.01); *H01L 31/1864* (2013.01); *H01L 31/1884* (2013.01); *C23C 14/34* (2013.01); *H01L 31/022475* (2013.01); *H01L 31/03762* (2013.01); *H01L 31/075* (2013.01); *H01L 31/202* (2013.01)

(58) Field of Classification Search
    CPC ............... C23C 14/022; H01L 21/6776; H01L 31/0747; H01L 31/022475; H01L 21/67173; H01L 21/67742; H01L 31/03762; H01L 31/202; H01L 31/1864; H01L 31/1884; H01L 31/075; H01L 37/3488; H01L 37/32752; H01L 37/32761
    See application file for complete search history.

(56) References Cited

U.S. PATENT DOCUMENTS

| | | | |
|---|---|---|---|
| 2011/0240462 A1* | 10/2011 | Yamazaki | H01J 37/32458 204/192.25 |
| 2011/0272021 A1* | 11/2011 | Takahashi | H01L 31/1884 136/256 |
| 2012/0174972 A1* | 7/2012 | Fujishima | C23C 14/08 136/255 |

FOREIGN PATENT DOCUMENTS

| | | |
|---|---|---|
| JP | 61-237423 | 10/1986 |
| JP | 10-310862 | 11/1998 |
| JP | 4573162 | 3/2006 |
| JP | 2008-019478 | 1/2008 |
| JP | 2011-228368 | 10/2011 |
| JP | 85374250 | 12/2013 |
| JP | 2014-203924 | 10/2014 |
| KR | 10-2010-0067119 | 6/2010 |
| KR | 10-1210533 | 12/2012 |
| TW | 1253477 | 4/2006 |
| TW | I253477 | 4/2006 |
| TW | 201324818 | 6/2013 |
| TW | 1527247 | 3/2016 |
| TW | I527247 | 3/2016 |
| WO | 2008/146693 | 12/2008 |
| WO | 2011/034143 | 3/2011 |

OTHER PUBLICATIONS

Office Action from related Taiwanese Appln. No. 106110260, dated Jul. 2, 2019. Partial English translation attached.
International Search Report from corresponding PCT Application No. PCT/JP2017/011724 dated May 23, 2017 English translation attached.
Notice of Allowance from related Korean Appln. No. 10-2018-7020364 dated Dec. 11, 2019 English translation attached.

* cited by examiner

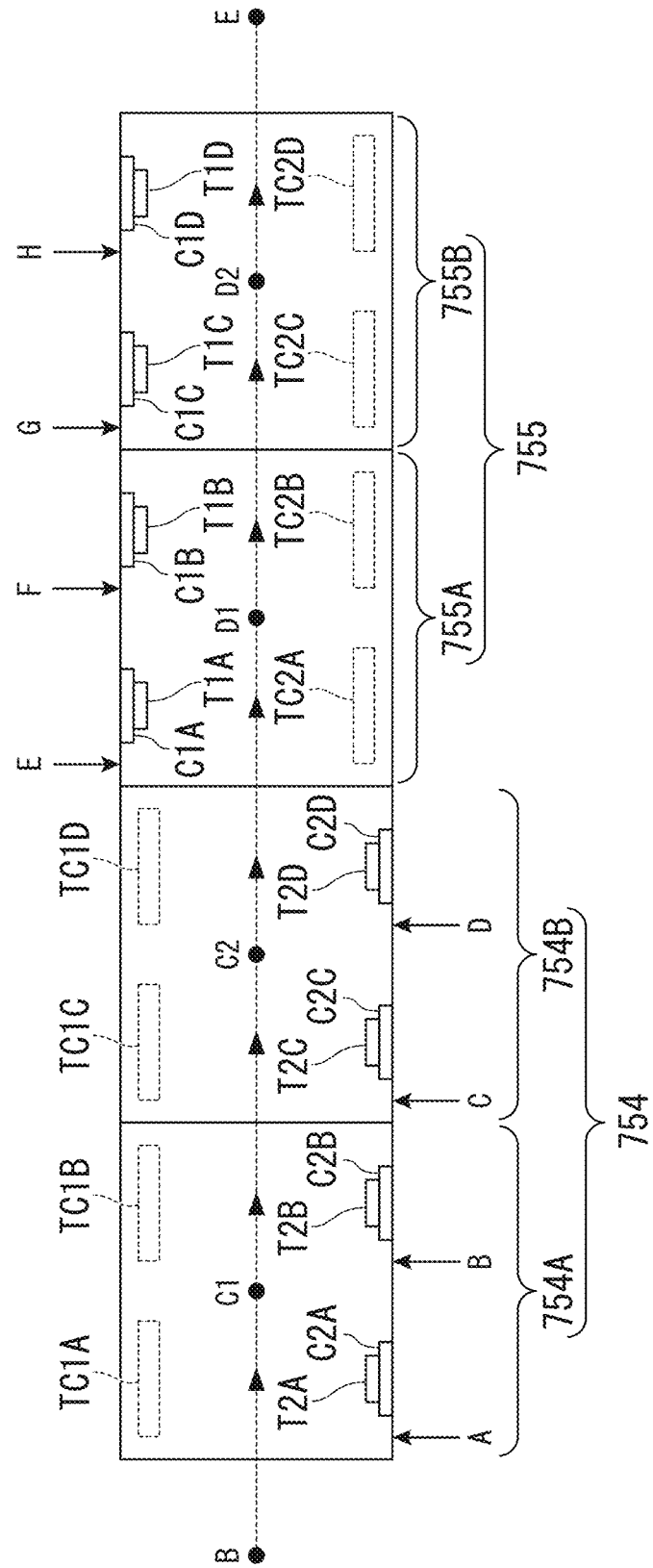

FIG. 21

| ITEMS | COMPARATIVE EXAMPLE 1 | COMPARATIVE EXAMPLE 2 | COMPARATIVE EXAMPLE 3 | EXAMPLE 1 | EXAMPLE 2 | EXAMPLE 3 | EXAMPLE 4 |
|---|---|---|---|---|---|---|---|
| TEMPERATURE BEFORE FILM FORMATION (°C) | 25 TO 30 (ROOM TEMPERATURE) | | | 150 | | | |
| TOTAL PRESSURE (Pa) | 0.7 | | | | | | |
| $O_2/Ar$ (%) | 4.50 | | | | | | |
| $H_2O/Ar$ (%) | 0.0 | 2.0 | 0.0 | 2.0 | 4.0 | 6.0 | 8.0 |
| CONDITIONS OF POST-HEAT TREATMENT | IN AIR, 200 °C, 30 MIN | | | | | | |
| FILM THICKNESS (nm) | 115 | | | | | | |
| SHEET RESISTANCE ($\Omega/\square$) | 49.9 | 47.8 | 36.7 | 42.1 | 47.7 | 88.3 | 101.5 |
| HOLE MOBILITY ($cm^2/Vs$) | 30 | 41.2 | 37.8 | 53.8 | 52.9 | 53.9 | 27.4 |
| CARRIER DENSITY ($E^{+20}/cm^3$) | 3.95 | 3.24 | 4.13 | 2.77 | 2.28 | 1.41 | 2.22 |
| ABSORPTIVITY (WAVELENGTH OF 1150 nm) (%) | 4.15 | 2.96 | 4.93 | 2.11 | 0.99 | 0.33 | 5.26 |

Table 3

METHOD OF MANUFACTURING SUBSTRATE WITH A TRANSPARENT CONDUCTIVE FILM, MANUFACTURING APPARATUS OF SUBSTRATE WITH TRANSPARENT CONDUCTIVE FILM, SUBSTRATE WITH TRANSPARENT CONDUCTIVE FILM, AND SOLAR CELL

CROSS-REFERENCE TO RELATED APPLICATION

This application is a U.S. National Phase Application filed under 35 U.S.C. § 371 of International Patent Application No. PCT/JP2017/011724 filed Mar. 23, 2017, which designated the United States and was published in a language other than English, which claims priority to Japanese Patent Application No. 2016-066579 filed on Mar. 29, 2016, both of which are incorporated by reference herein.

TECHNICAL FIELD

The present invention relates to: a method of manufacturing a substrate with a transparent conductive film which exhibits a low absorptivity in a range of a visible range to a near infrared region, can be formed by high speed film formation, and has excellent surface flatness; a manufacturing apparatus of a substrate with a transparent conductive film; a substrate with a transparent conductive film; and a solar cell.

BACKGROUND

Conventionally, in a solar cell using crystalline silicon as a substrate (crystalline solar cell), it is well known that a hetero junction solar cell obtains a high degree of power generation efficiency (for example, Patent Document 1).

FIG. 20 is a cross-sectional view schematically showing an example of a conventional hetero junction (Hetero junction with Intrinsic Thin-layer) solar cell. As shown in FIG. 20, a hetero junction solar cell 500 includes a structure in which a thin film made of an amorphous Si semiconductor is layered on both surfaces of a substrate 501 made of an n-type single-crystalline Si semiconductor. Hereinbelow, "amorphous Si" is represented as "a-Si".

An i-type a-Si semiconductor layer 502 and a p-type a-Si semiconductor layer 503 are sequentially layered on one surface side 501a (upper surface side in FIG. 20) of the substrate 501 which forms a light incidence surface. A transparent conductive film 504 that is electrically connected to the p-type a-Si semiconductor layer 503 and an electrode 505 serving as a comb-shaped positive electrode are sequentially disposed and layered on the p-type a-Si semiconductor layer 503.

An i-type a-Si semiconductor layer 512 and an n-type a-Si semiconductor layer 513 are sequentially layered on the other surface side 501b (lower surface side in FIG. 20) of the substrate 501 which forms a non-light incidence surface. A transparent conductive film 514 electrically connected to the n-type a-Si semiconductor layer 513 and an electrode 515 serving as a comb-shaped negative electrode are sequentially disposed and layered on the n-type a-Si semiconductor layer 513. Since the transparent conductive films 504 and 514 and the electrodes 505 and 515 have a function of electrically collecting electrons generated from a silicon substrate and semiconductor layers, electrical contact between the transparent conductive film 504 and the electrode 505 and electrical contact between the transparent conductive film 514 and the electrode 515 affect power generation efficiency of a solar cell. For this reason, it is preferable that the surface of the transparent conductive film 504 on which the electrode 505 is to be layered and the surface of the transparent conductive film 514 on which the electrode 515 is to be layered have excellent surface flatness.

Additionally, in the hetero junction solar cell having the aforementioned configuration, in order to improve power generation efficiency, for example, it has been studied to widen an effective wavelength region. Particularly, a method is adopted which prompts an increase in transmissivity, in a near infrared region, of a transparent conductive film that functions as a window electrode and is disposed on the light incidence surface side (for example, Patent Document 2).

Patent Document 2 discloses a method of manufacturing a transparent conductive film having a high degree of transmissivity in a near infrared region by use of an RF magnetron sputtering method in which a substrate temperature is a room temperature during film formation. Since the RF sputtering method has a high degree of reactivity, there is an advantage in that the amount of water added to a processing gas during film formation may be low. However, since the film-forming rate is low, it is unsuitable for a high-volume production apparatus.

In contrast to this, a DC sputtering method that is preferable for a high-volume production apparatus and can ensure a high film-forming rate has been attracted attention. Here, in the case of adopting a DC sputtering method, since this method has a degree of reactivity lower than that of the RF sputtering method, it is necessary to increase the amount of water ($H_2O$) added to a processing gas during film formation. However, when a large amount of water is introduced into a process atmosphere, there are problems in that water is incorporated into the surface of an a-Si film that is present as a base film of the transparent conductive film, the a-Si film is oxidized, and a desired power generation efficiency cannot be obtained (the passivation function expected for the a-Si film becomes degraded in addition to that a resistance of the a-Si film becomes higher). Accordingly, development of a manufacturing method has been expected which manufactures a substrate with a transparent conductive film which exhibits a low absorptivity in a range of a visible range to a near infrared region, can be formed by high speed film formation, and has excellent surface flatness.

PRIOR ART DOCUMENTS

Patent Documents

[Patent Document 1] Japanese Unexamined Patent Application, First Publication No. 2014-203924
[Patent Document 2] PCT International Publication No. WO 2008/146693

SUMMARY

Problems to be Solved by the Invention

The invention was made in view of the above-described conventional situation, and has a first object to provide a method of manufacturing a substrate with a transparent conductive film and a manufacturing apparatus of a substrate with a transparent conductive film; the transparent conductive film exhibits a low absorptivity in a range of a visible range to a near infrared region and can be formed by a DC sputtering method suitable for high speed film formation.

Additionally, the invention has a second object to provide a substrate with a transparent conductive film which exhibits a low absorptivity in a range of a visible range to a near infrared region and has a reduced surface roughness.

Furthermore, the invention has a third object to provide a hetero junction solar cell utilizing a substrate with a transparent conductive film which exhibits a low absorptivity in a range of a visible range to a near infrared region and has a reduced surface roughness.

Means for Solving the Problems

A method of manufacturing a substrate with a transparent conductive film according to a first aspect of the invention, includes: preparing a base body that has a top surface and a back surface and has an a-Si film coating at least one of the top surface and the back surface; and setting temperatures of the base body and the a-Si film to be in the range of 70 to 220° C. in a film formation space having a processing gas containing hydrogen, applying a sputtering voltage to a target, carrying out DC sputtering, and thereby forming the a-Si film on a transparent conductive film.

In the method of manufacturing a substrate with a transparent conductive film according to the first aspect of the invention, ⅔ or more of the film thickness of a film thickness of the transparent conductive film to be formed on the a-Si film may be formed at a film-forming rate of 10 (nm·m/min) or more.

The method of manufacturing a substrate with a transparent conductive film according to the first aspect of the invention may further includes controlling a proportion of a gas containing the hydrogen to the processing gas so that an amount of hydrogen contained in the transparent conductive film is greater than or equal to $1\times10^{21}$ (atoms/cm$^3$) when the transparent conductive film is formed.

In the method of manufacturing a substrate with a transparent conductive film according to the first aspect of the invention, a crystalline silicon base member formed in a flat-plate shape may be used as the base body, an i-type a-Si film and a p-type a-Si film may be sequentially layered on one of main surfaces of the base body in this order in advance, and an i-type a-Si film and an n-type a-Si film may be sequentially layered on the other of the main surfaces of the base body in this order in advance.

The method of manufacturing a substrate with a transparent conductive film according to the first aspect of the invention may further includes carrying out post-heat treatment on the transparent conductive film formed on the a-Si film.

The method of manufacturing a substrate with a transparent conductive film according to the first aspect of the invention may further includes supplying a gas containing hydrogen to an upstream side of the target in a transfer direction in which the base body is transferred in a film formation chamber, wherein the transparent conductive film may be formed on the a-Si film of the base body so as to contain the hydrogen supplied to the upstream side.

The method of manufacturing a substrate with a transparent conductive film according to the first aspect of the invention may further includes setting temperatures of the base body and the a-Si film in a range of 70 to 150° C. before forming the transparent conductive film on the a-Si film.

A manufacturing apparatus of a substrate with a transparent conductive film according to a second aspect of the invention, includes: a heating chamber that heats a base body having a top surface, a back surface, and an a-Si film coating at least one of the top surface and the back surface; a film formation chamber that includes a temperature control device and a target and is connected to the heating chamber, an exhaust device, and a power supply; a processing gas introduction mechanism that supplies a processing gas containing hydrogen to the film formation chamber; and a transfer mechanism that transfers the base body from the heating chamber to the film formation chamber and horizontally holds the base body so that the base body faces the target in the film formation chamber, wherein the processing gas introduction mechanism supplies the processing gas to the film formation chamber and a film formation space having a processing gas containing hydrogen is thereby formed in the film formation chamber, and temperatures of the base body and the a-Si film are set in the range of 70 to 220° C., the power supply applies a sputtering voltage to the target, DC sputtering is carried out, and a transparent conductive film is thereby formed on the a-Si film.

In the manufacturing apparatus of a substrate with a transparent conductive film according to the second aspect of the invention, ⅔ or more of the film thickness of a film thickness of the transparent conductive film to be formed on the a-Si film may be formed at a film-forming rate of 10 (nm·m/min) or more.

In the manufacturing apparatus of a substrate with a transparent conductive film according to the second aspect of the invention, a proportion of a gas containing the hydrogen to the processing gas may be controlled in the film formation chamber so that an amount of hydrogen contained in the transparent conductive film is greater than or equal to $1\times10^{21}$ (atoms/cm$^3$) when the transparent conductive film is formed.

In the manufacturing apparatus of a substrate with a transparent conductive film according to the second aspect of the invention, the processing gas introduction mechanism may supply a gas containing hydrogen to an upstream side of the target in a transfer direction in which the base body is transferred in the film formation chamber, and the transparent conductive film may be formed on the a-Si film of the base body so as to contain the hydrogen supplied to the upstream side.

In the manufacturing apparatus of a substrate with a transparent conductive film according to the second aspect of the invention, the heating chamber may set temperatures of the base body and the a-Si film in a range of 70 to 150° C. before forming the transparent conductive film on the a-Si film.

The manufacturing apparatus of a substrate with a transparent conductive film according to the second aspect of the invention may further includes a holder that supports the base body on which the a-Si film is formed, wherein the holder may include a holder body and a protruding portion that protrudes from the holder body and shields an outer-periphery of the a-Si film, and the transfer mechanism may transfer the base body supported by the holder to an inside of the film formation chamber.

A substrate with a transparent conductive film according to a third aspect of the invention, includes: a base body having a top surface and a back surface; an a-Si film coating at least one of the top surface and the back surface; and a transparent conductive film formed on the a-Si film, an amount of hydrogen contained in the transparent conductive film is greater than or equal to $1\times10^{21}$ (atoms/cm$^3$).

In the substrate with a transparent conductive film according to the third aspect of the invention, an amount of hydrogen contained in the transparent conductive film may increase in a direction from a boundary face between the transparent conductive film and the a-Si film to an outer side of the transparent conductive film.

In the substrate with a transparent conductive film according to the third aspect of the invention, a non-film formation region on which the transparent conductive film is not formed may be provided on an outer-periphery of the a-Si film formed on the base body.

In the substrate with a transparent conductive film according to the third aspect of the invention, a surface roughness Ra of the transparent conductive film may be less than or equal to 1.0 (nm).

A solar cell according to a fourth aspect of the invention, includes: a substrate with a transparent conductive film, which includes a base body having a top surface and a back surface; an a-Si film coating at least one of the top surface and the back surface; and a transparent conductive film formed on the a-Si film, wherein an amount of hydrogen contained in the transparent conductive film may be greater than or equal to $1 \times 10^{21}$ (atoms/cm$^3$).

In the solar cell according to the fourth aspect of the invention, an amount of hydrogen contained in the transparent conductive film may increase in a direction from a boundary face between the transparent conductive film and the a-Si film to an outer side of the transparent conductive film.

In the solar cell according to the fourth aspect of the invention, a non-film formation region on which the transparent conductive film is not formed may be provided on an outer-periphery of the a-Si film formed on the base body.

Effects of the Invention

With the manufacturing method according to the first aspect of the invention and the manufacturing apparatus according to the second aspect of the invention, as a result of using a gas containing hydrogen as a processing gas and carrying out high speed film formation by a DC sputtering method, a transparent conductive film containing a desired hydrogen content is formed on a-Si film coating the base body. Consequently, a transparent conductive film exhibiting a low absorptivity in a range of a visible range to a near infrared region is obtained. In this situation, as a result of setting a temperature of the a-Si film serving as a foundation of the transparent conductive film to be in the range of 70 to 220° C., the problems in that water is incorporated into the surface of the a-Si film and the a-Si film is oxidized (the problems in that the passivation function expected for the a-Si film becomes degraded in addition to that a resistance of the a-Si film becomes higher) are solved.

Therefore, according to the first and second aspects of the invention, for example, in the case of using a crystalline silicon base member formed in a flat-plate shape as a base body having both the top surface and the back surface which are coated with an a-Si film, it is possible to manufacture a substrate with a transparent conductive film which is preferably used for a solar cell that can obtain a desired power generation efficiency. In addition, by use of a transparent insulative base member made of glass or resin as a base body having a surface which is coated with an a-Si film, it is possible to manufacture a substrate with a transparent conductive film which is preferably used for various light-receiving-emitting photodetectors, display panels, or the like.

In the substrate with a transparent conductive film according to the third aspect of the invention, on the base body on which both or one of the top surface and the back surface are coated with the a-Si, a transparent conductive film is disposed film so as to coat the a-Si film. Furthermore, an amount of hydrogen contained in the transparent conductive film is greater than or equal to $1 \times 10^{21}$ (atoms/cm$^3$). Therefore, a low absorptivity in a range of a visible range to a near infrared region is achieved. Moreover, since the transparent conductive film has a flat surface profile, improvement in electrical contact between the structure that is formed in contact with the transparent conductive film and the transparent conductive film is achieved.

Consequently, the substrate with the transparent conductive film according to the third aspect of the invention has an excellent function in a wide range of a visible range to a near infrared region and contributes to realizing a solar cell, various light-receiving-emitting photodetectors, display panel, or the like, in which electrical contact between the structure that is in contact with the transparent conductive film and the transparent conductive film is improved.

In the solar cell according to the fourth aspect of the invention, since a content (atoms/cm$^3$) of hydrogen contained in the transparent conductive film is greater than or equal to $1 \times 10^{21}$, the transparent conductive film achieves a low absorptivity in a range of a visible range to a near infrared region. For this reason, in the solar cell according to the fourth aspect of the invention, near-infrared light in addition to visible light can be utilized for power generation. Furthermore, since the transparent conductive film has a flat surface profile, improvement in electrical contact between an electrode that is formed in contact with the transparent conductive film and the transparent conductive film is achieved.

Because of this, in the fourth aspect of the invention, a hetero junction solar cell having a high degree of power generation efficiency is obtained. As a result, the fourth aspect of the invention contributes to provision of a solar cell used for, for example, installation of a house roof.

BRIEF DESCRIPTION OF THE DRAWINGS

FIG. 8B is a schematic diagram showing a modified example 1 of the manufacturing apparatus of the substrate with the transparent conductive film.

FIG. 21 is a table showing results of evaluating a film quality of the transparent conductive film.

DETAILED DESCRIPTION

Hereinafter, a best mode of a method of manufacturing a substrate with a transparent conductive film according to the invention will be described with reference to drawings. The embodiment is specifically explained for appropriate understanding the scope of the present invention, and does not limit the present invention unless otherwise specified.

First Embodiment

Hereinbelow, a method will be described with reference to FIG. 1 which manufactures a substrate with a transparent conductive film so that, on the base body having both a top surface and a back surface which are coated with an a-Si film, the transparent conductive film is disposed so as to coat the a-Si film.

Figure 1:
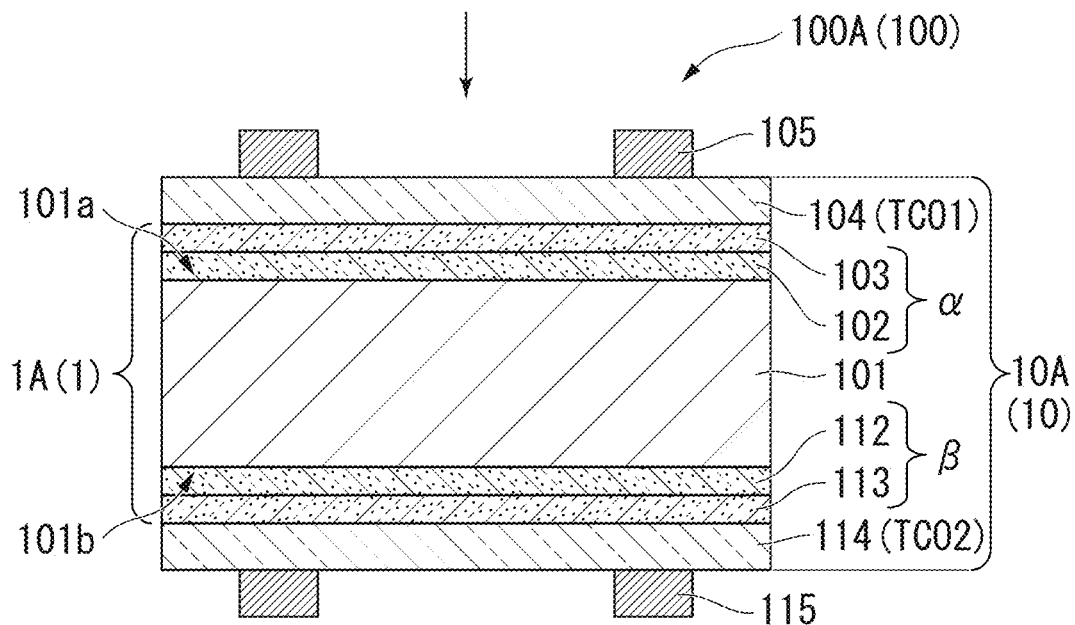
FIG. 1 is a cross-sectional view showing an example of a substrate with a transparent conductive film and a solar cell including the substrate with the transparent conductive film.

FIG. 1 is a cross-sectional view showing a substrate with a transparent conductive film and an example (first embodiment) of a solar cell including the substrate with the transparent conductive film.

In FIG. 1, a base body 101 (substrate) that forms a substrate 10A (10) with a transparent conductive film is a crystalline silicon base member formed in a flat-plate shape, and both a top surface 101a and a back surface 101b of the base body 101 are coated with the a-Si film. In FIG. 1, the arrow (downward direction) directed to the top surface 101a of the base body 101 represents a light incident direction.

The a-Si film (in FIG. 1, represented as a) provided on the top surface 101a which is a light incidence side is configured of an i-type a-Si film 102 that is provided on and in touch with the top surface 101a and a p-type a-Si film 103 that is provided above the i-type a-Si film 102. Additionally, a transparent conductive film 104 is provided so as to coat the p-type a-Si film 103 serving as an outer surface of the a-Si film (a). Furthermore, an electrode 105 made of a metal film is disposed on an outer surface of the transparent conductive film 104.

In contrast, the a-Si film (in FIG. 1, represented as β) provided on the back surface 101b which is a non-light incidence side is configured of an i-type a-Si film 112 that is provided on and in touch with the back surface 101b and an n-type a-Si film 113 that is provided above the i-type a-Si film 112. Moreover, a transparent conductive film 114 is provided so as to coat the n-type a-Si film 113 forming an outer surface of the a-Si film (β). Furthermore, an electrode 115 made of a metal film is disposed on an outer surface of the transparent conductive film 114.

Hereinbelow, a structure having the a-Si film (α) and the a-Si film (β) which are disposed on the base body 101 is referred to as an intermediate structure 1A (1). The structure in which the transparent conductive film 104 and the transparent conductive film 114 are provided on the intermediate structure 1A (1) is the substrate 10A (10) with the transparent conductive film. In addition, the structure which use a crystalline silicon base member as the base body 101 and provides the electrode 105 and the electrode 115 on the substrate 10A (10) with the transparent conductive film is a solar cell 100A (100).

From Table 3 which will be described later, it was found that, as a result of carrying out a manufacturing method of the invention which will be particularly described later, that is "a manufacturing method forming a film on heated a-Si films (α, β) by sputtering using a processing gas containing hydrogen", a transparent conductive film exhibiting a low absorptivity not only in a visible range but also in a near infrared region is obtained as the transparent conductive films 104 and 114 having the aforementioned configuration (FIG. 1).

Additionally, from Table 4 which will be described later, it was observed that a transparent conductive film having a surface roughness less than 1 nm can be stably manufactured by a manufacturing method according to the embodiment of the invention.

From Table 6 which will be described later, it was apparent that, by use of a manufacturing method according to the embodiment of the invention, a solar cell is obtained which includes a transparent conductive film exhibiting a low absorptivity in a range of a visible range to a near infrared region and therefore can effectively utilize near-infrared light in addition to visible light for power generation.

Particularly, in the case of manufacturing the substrate with the transparent conductive film having the configuration shown in FIG. 1, as a result of setting temperatures of the a-Si films (α, β) which forms a foundation of the transparent conductive film to be in the range of 70 to 220° C., the surface of the a-Si film becomes less likely to incorporate water. Consequently, it was apparent that the effect of solving the problem in that the a-Si film is oxidized (that is, the problems in that the passivation function expected for the a-Si film becomes degraded in addition to that the resistance of the a-Si film becomes higher).

Therefore, according to the embodiment of the invention, for example, in the case of using a crystalline silicon base member formed in a flat-plate shape as a base body having both the top surface and the back surface which are coated with an a-Si film (FIG. 1), it is possible to manufacture a substrate with a transparent conductive film which is preferably used for a solar cell that can obtain a desired power generation efficiency in a range of a visible range to a near infrared region.

Note that, the configuration in which an antireflection layer (Anti Reflection Layer: AR layer) which is not shown in the figure is disposed near the top surface 101a of the base body 101 may be adopted as necessary. As the antireflection layer (not shown in the figure), for example, an insulating nitride film, a silicon nitride film, a titanium oxide film, an aluminum oxide coating, or the like is preferably used.

Figure 7A:
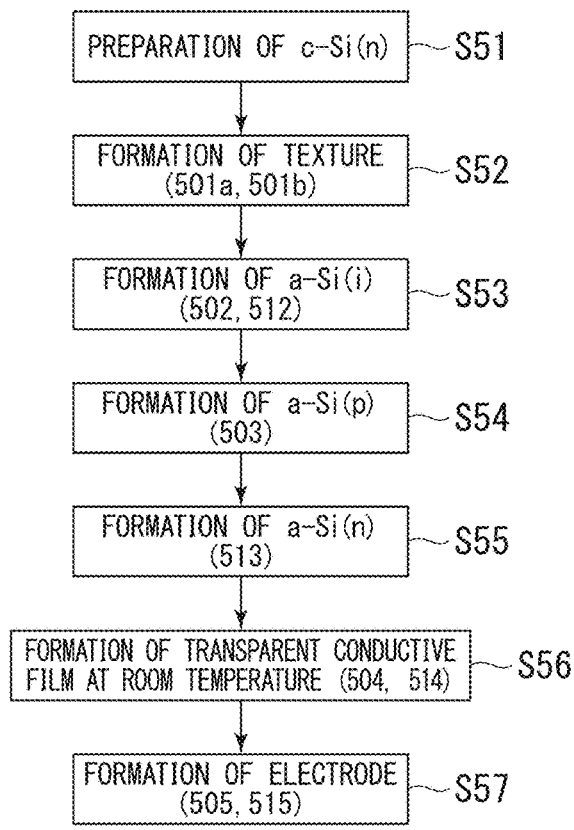
FIG. 7A is a flowchart showing a conventional method of manufacturing a substrate with a transparent conductive film.
Figure 7B:
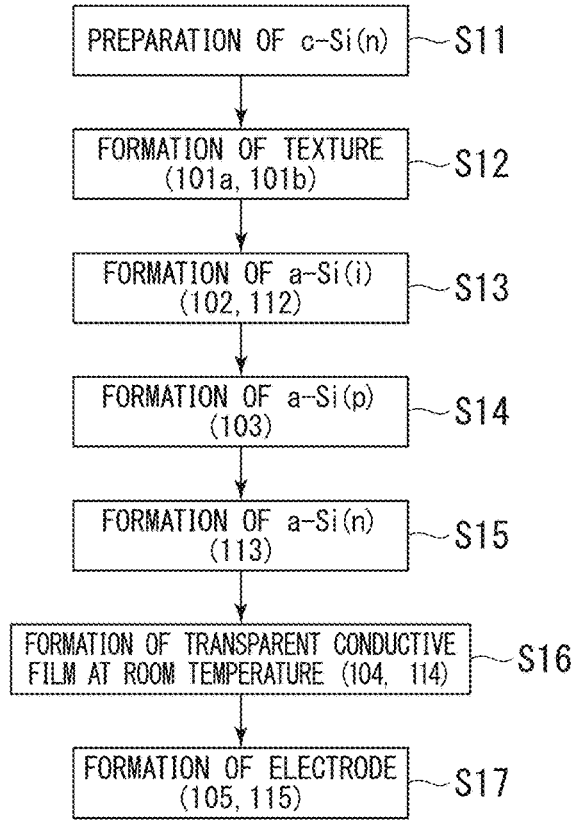
FIG. 7B is a flowchart showing a method of manufacturing a substrate with a transparent conductive film according to an embodiment of the invention.

FIGS. 7A and 7B are flowcharts showing a method of manufacturing a substrate with a transparent conductive film, FIG. 7A shows a conventional case, and FIG. 7B shows an embodiment of the invention. The conventional case is different from the embodiment of the invention in "S16" which will be described below in detail.

The conventional substrate with a transparent conductive film is formed by process flow S51 to S57 which are shown in FIG. 7A. That is, the manufacturing is carried out by seven processing steps of "preparation of c-Si (n), formation of texture, formation of i-type a-Si, formation of p-type a-Si, formation of n-type a-Si, formation of transparent conductive film at room temperature, and formation of electrode" in this order. Particularly, the step of the conventional method of manufacturing the substrate with the transparent conductive film is characterized in that a transparent conductive film is formed by use of a sputtering method at a room temperature in S56. Here, in the case where an RF sputtering method is adopted in S56, there are problems in that a film-forming rate is slow and it is unsuitable for a high-volume production. Specifically, when the inventors carry out an experiment in which a transparent conductive film is formed by an RF sputtering method, in the case where a RF power is 3 kW and a transparent conductive film is formed, a result was obtained in which the film-forming rate is 6.3 (nm·m/min). Additionally, when an experiment of forming a transparent conductive film by a higher RF power is carried out, RF electric discharge is unstable, a film-forming rate higher than 6.3 (nm·m/min) cannot be stably realized.

In contrast, the substrate with the transparent conductive film according to the embodiment of the invention is formed by process flow S11 to S17 which are shown in FIG. 7B. Here, S11 to S15 and S17 are the same as S51 to S55 and S57, respectively. On the other hand, S16 according to the embodiment of the invention is the step different from the conventional S56. Particularly, S16 is the step of heating and forming a transparent conductive film by use of a DC sputtering method. In S16, a gas containing hydrogen as a processing gas is used and high speed film formation is carried out by a DC sputtering method.

Since the DC sputtering method according to the embodiment of the invention can form a transparent conductive film at the film-forming rate approximately twice than that of the conventional RF sputtering method in the case where the same input electric power is applied thereto, it is excellent for use in mass production.

As compared with the case of forming a transparent conductive film by a conventional RF sputtering method, in the embodiment of the invention forming a transparent conductive film by the DC sputtering method, it is possible to obtain a higher film-forming rate. Specifically, when the inventors carry out an experiment in which a transparent conductive film is formed by a DC sputtering method, in the case where a DC power is in the range of 7.8 to 22 kW and a transparent conductive film is formed, it was apparent that a high film-forming rate is obtained such as 13 to 48 (nm·m/min).

Particularly, in a manufacturing apparatus that produces a substrate with a transparent conductive film, in consideration of mass production including the cost of manufacturing or the like, it is necessary to form a transparent conductive film on a base body at a film-forming rate greater than or equal to 10 (nm·m/min). For this reason, according to the above-mentioned film formation step, since a film-forming rate greater than or equal to 10 (nm·m/min) is obtained, it is possible to manufacture a substrate with a transparent conductive film at a high degree of mass productivity. Moreover, it is thought that a layered structure is adopted as a film configuration of the transparent conductive film. Therefore, it is preferable that ⅔ or more of the film thickness of the transparent conductive film be formed at a film-forming rate of 10 (nm·m/min) or more.

Additionally, as a result of using a gas containing hydrogen as a processing gas, it is possible to form a transparent conductive film containing a desired hydrogen on the a-Si film coating the base body. In this situation, as a result of heating and forming the transparent conductive film (that is, a film is formed while maintaining temperatures of the a-Si films (α, β) which each forms a foundation of the transparent conductive film to be in the range of 70 to 220° C.), it is possible to prevent water from being incorporated into the surface of the a-Si film.

The temperature range will be more particularly described.

In the embodiment of the invention, before forming the transparent conductive film on the a-Si films (α, β), it is preferable to set temperatures of the base body and the a-Si film in a range of 70 to 150° C. Such setting of the temperatures is carried out in a heating chamber (H) 752 and a film-formation entrance chamber (EN) 753 of a sputtering apparatus 700 which will be described later.

In the case where temperatures of a base body and an a-Si film before forming a transparent conductive film are greater than or equal to 70° C., since a desorption rate of water is higher at two orders of magnitude or more than the value at a room temperature, even where water temporarily adsorbs to an a-Si film, it becomes in a state of being re-removed. This means that it is possible to prevent water from being incorporated into the surface of the a-Si film. In contrast, in the case where it is lower than 70° C., water that is once adsorbed to the a-Si film is less likely to be removed, and it is not preferable.

As a result of setting temperatures of the base body and the a-Si film before forming a transparent conductive film to be lower than 150° C., temperatures of the base body and the a-Si film can be lower than or equal to 220° C. even where heat due to sputtering is input thereto.

In the case where the temperature at which a transparent conductive film is formed on a base body is higher than 220° C., since an a-Si film forming a foundation is polycrystallized and the passivation function expected for the a-Si film becomes degraded, it is not preferable.

When a transparent conductive film is formed on the a-Si films (α, β) of the base body by a DC sputtering method, the base body receives heat from plasma and a temperature of the base body thereby increases; however, since a temperature of the base body after film formation is limited to be less than or equal to 220° C., it is possible to inhibit the film quality from being degraded such that the a-Si film is oxidized. Furthermore, even in the case of carrying out film formation at a film-forming rate of 10 (nm·m/min), since a temperature of the base body after film formation is limited to be less than or equal to 220° C., the aforementioned effect is obtained.

Next, regarding an increase in a temperature of a base body due to heat reception by the base body from plasma, results that the inventors carry out experiments will be described.

TABLE 1

| TEMPERATURE OF BASE BODY BEFORE FILM FORMATION | LESS THAN 70° C. | 70° C.~150° C. | MORE THAN 150° C. |
|---|---|---|---|
| TEMPERATURE OF BASE BODY DURING FILM FORMATION | LESS THAN OR EQUAL TO 220° C. | LESS THAN OR EQUAL TO 220° C. | MORE THAN 220° C. |
| QUALITY OF a-Si FILM | Δ | ⊚ | X |

In Table 1, in the case where a temperature of the base body before film formation is less than 70° C., a temperature of the base body during film formation becomes less than or equal to 220° C. (Symbol "Δ": poor). In this condition, it is insufficient for water to be removed from the base body, and a result was obtained in which it adversely affects the film quality of the a-Si film.

Additionally, in the case where a temperature of the base body before film formation exceeds 150° C., a temperature of the base body during film formation exceeds 220° C. (Symbol "x": bad). In this condition, a result was obtained in which the a-Si film is polycrystallized.

In contrast, in the case where a temperature of the base body before film formation is within a range of 70° C. to 150° C., a temperature of the base body during film formation becomes less than or equal to 220° C. (Symbol "⊚": excellent). In this condition, it is sufficient for water to be removed from the base body, the a-Si film is not polycrystallized, and it shows a result in which an excellent a-Si film is obtained.

Next, specific examples (actual achievements 1 and 2) will be described in the case where a temperature of the base body before film formation is within a range of 70° C. to 150° C. and film formation of a transparent conductive film is carried out.
(Actual Achievement 1)

In a state where the temperature of the base body before film formation is 70° C. and DC power is 22 kW, film formation of a transparent conductive film was carried out so that a film-forming rate becomes 48 (nm·m/min). The temperature of the base body after film formation was 210° C.
(Actual Achievement 2)

In a state where the temperature of the base body before film formation is 150° C. and DC power is 7.6 kW, film formation of a transparent conductive film was carried out so that a film-forming rate becomes 13.4 (nm·m/min). The temperature of the base body after film formation was 190° C.

It is apparent from the above-described actual achievements 1 and 2 that, even in the case the base body receives heat from plasma and a temperature of the base body thereby increases, as a result of setting a temperature of the base body before film formation within a range of 70 to 150° C. and forming a transparent conductive film, the problem in that the a-Si film serving as a foundation of the transparent conductive film is polycrystallized (that is, the problem in that the passivation function expected for the a-Si film becomes degraded) is solved. Moreover, it is possible to sufficiently remove water from the base body.

In addition, in the above-described actual achievements 1 and 2, film formation of a transparent conductive film can be carried out at a film-forming rate of 10 nm·m/min or more.

Furthermore, when a transparent conductive film is heated formed by a DC sputtering method, a profile of the outer surface (film surface) of the transparent conductive film to be formed thereon is controlled by use of a gas containing hydrogen as a processing gas, and it is possible to achieve a film surface profile having small irregularities. Consequently, even in the case of high speed film formation by a DC sputtering method, it is possible to stably manufacture a transparent conductive film having a flat surface profile. Accordingly, the embodiment of the invention contributes to process for volume production for a substrate with a transparent conductive film.
(Modified Example of First Embodiment)

Note that, in the substrate 10A (10) with the transparent conductive film according to the aforementioned first embodiment, a structure is adopted in which light is not incident to the back surface 101b; however, the invention is not limited to this structure. For example, a bifacial (double-sided light receiving) structure may be adopted to a substrate with a transparent conductive film. In the embodiment of the invention, as a method of reducing damage to an a-Si film formed as an underlying layer of the transparent conductive film, TCO is formed on both surfaces of the base body 101 by a sputtering method. Therefore, the embodiment of the invention is easily applicable to a bifacial structure.

Second Embodiment

Figure 2A:
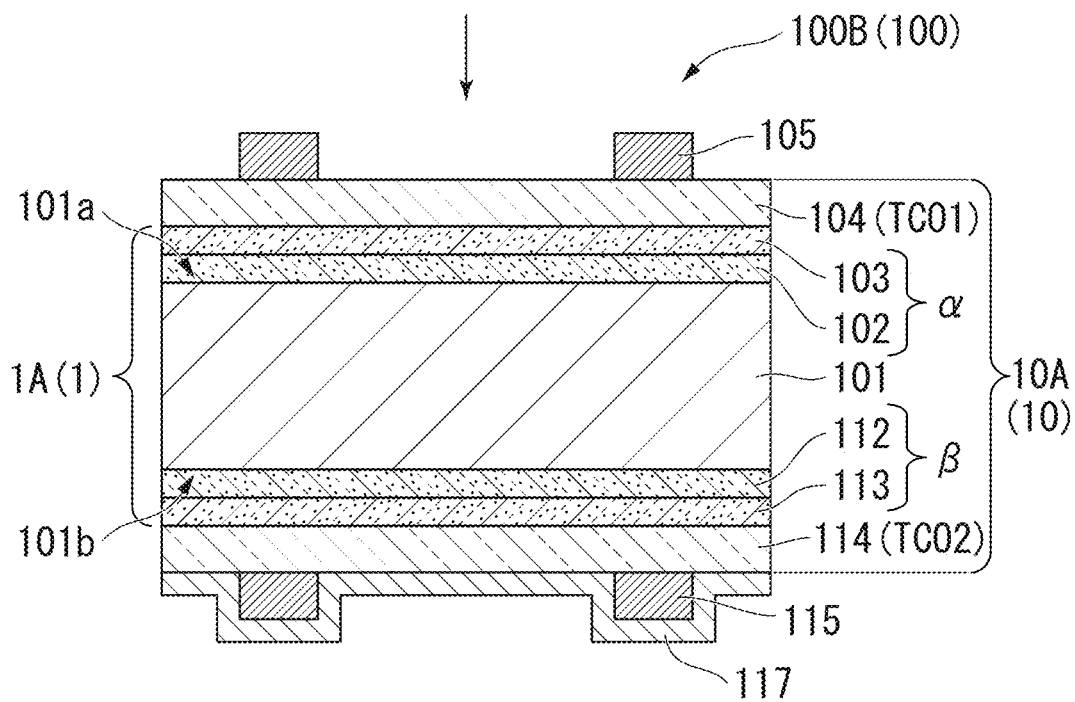
FIG. 2A is a cross-sectional view showing other example of the substrate with the transparent conductive film and the solar cell including the substrate with the transparent conductive film.

FIG. 2A is a cross-sectional view showing other example (second embodiment) of the substrate with the transparent conductive film and the solar cell including the substrate with the transparent conductive film. A solar cell 100B (100) shown in FIG. 2A is different from the configuration shown in FIG. 1 in that a reflection film 117 is provided near the back surface 101b of the base body 101.

In the case (FIG. 2A) where the reflection film 117 is added on a back surface in addition to the configuration shown in FIG. 1, a degree of incorporation of incident light into the intermediate structure 1A (1) functioning as a photoelectric conversion layer further increases, and improvement in power generation efficiency is achieved.

Consequently, according to the embodiment, in the case (FIGS. 1 and 2A) where a crystalline silicon base member formed in a flat-plate shape is used as a base body having both the top surface and the back surface which are coated with the a-Si film, since near-infrared light in addition to visible light can be effectively utilized for power generation, it is possible to provide a substrate with a transparent conductive film which is preferably used for a solar cell that can achieve power generation efficiency higher than in a conventional case.

Next, modified examples 1 and 2 will be described regarding an example of a substrate with a transparent conductive film and a solar cell including the substrate with the transparent conductive film.

Figure 2B:
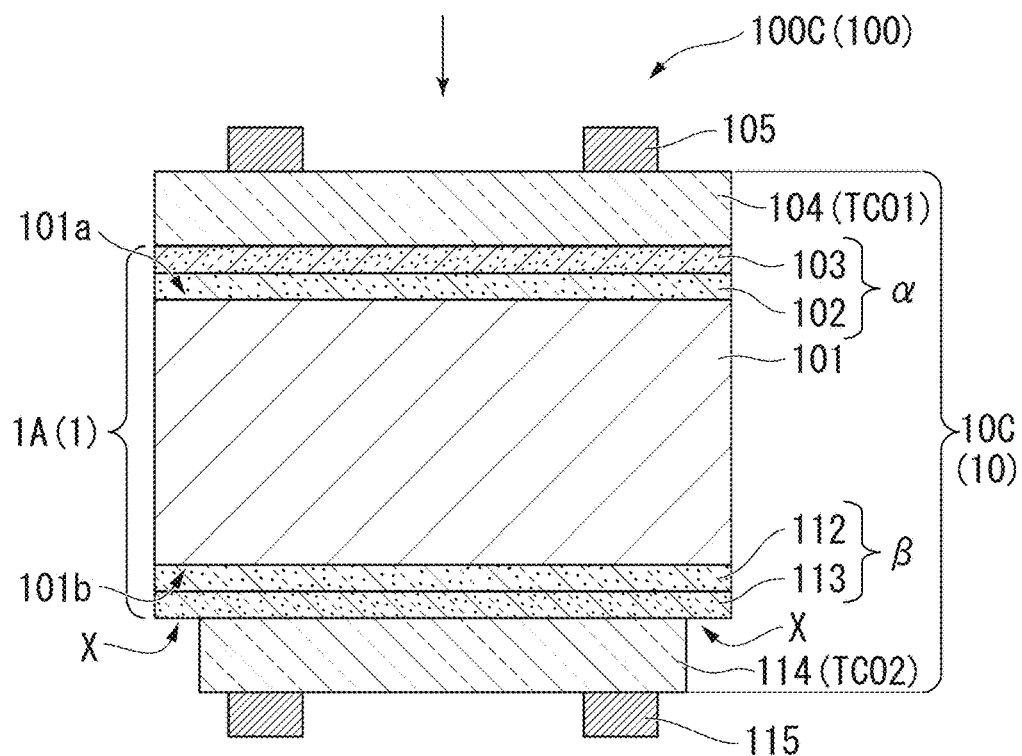
FIG. 2B is a cross-sectional view showing other example of the substrate with the transparent conductive film and the solar cell including the substrate with the transparent conductive film.
Figure 2C:
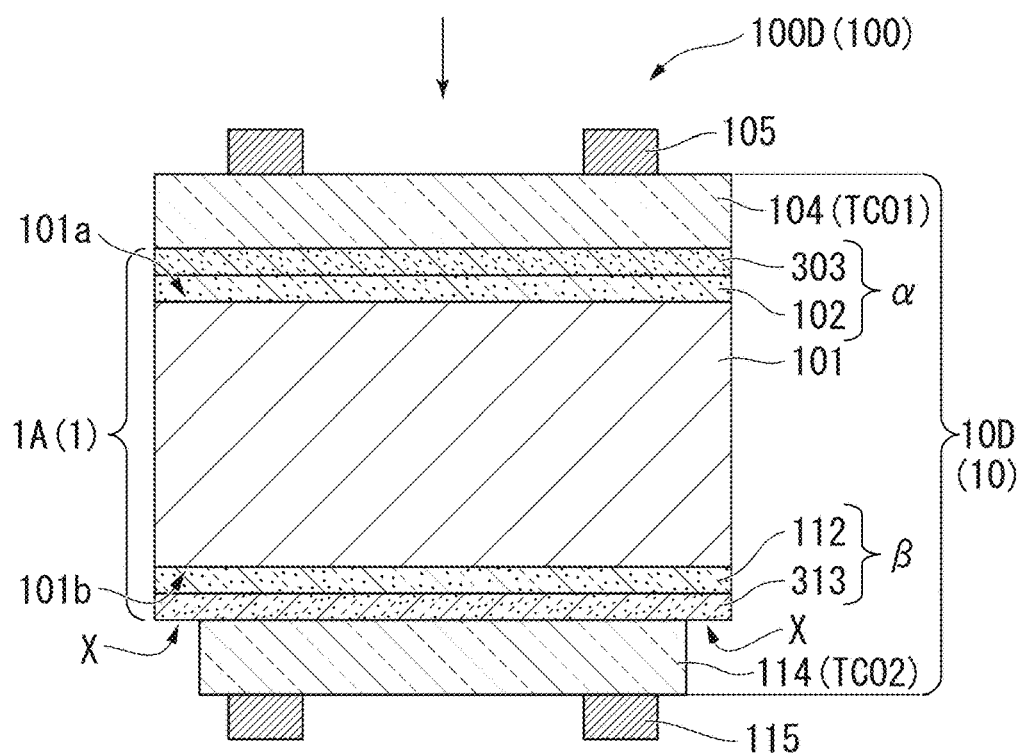
FIG. 2C is a cross-sectional view showing other example of the substrate with the transparent conductive film and the solar cell including the substrate with the transparent conductive film.
Figure 2D:
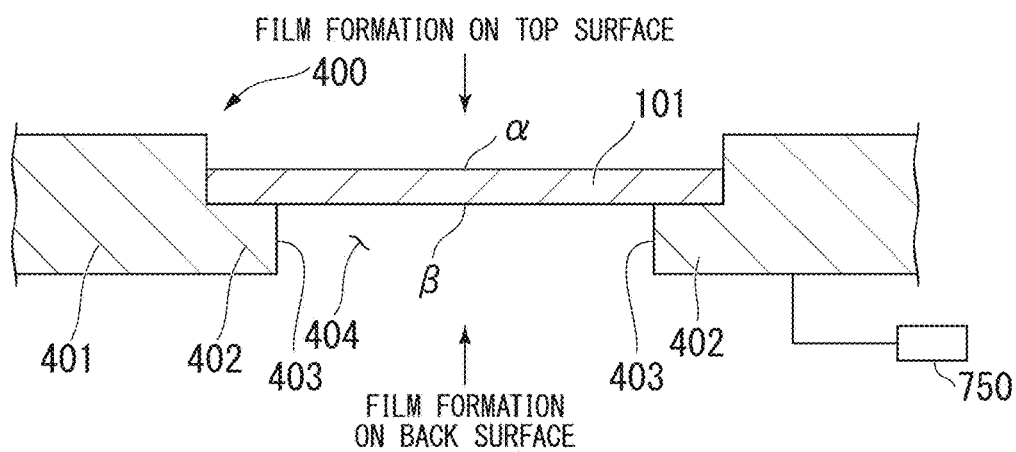
FIG. 2D is a cross-sectional explanatory view showing steps of forming a non-film formation region on the substrate with the transparent conductive film.

In FIGS. 2B to 2D, identical reference numerals are used for the elements which are identical to those of the first embodiment shown in FIG. 1, and the explanations thereof are omitted or simplified here.

(Modified Example 1 of Substrate with Transparent Conductive Film and Solar Cell Including Substrate with Transparent Conductive Film)

FIG. 2B is a cross-sectional view showing a modified example 1 of the substrate with the transparent conductive film and the solar cell including the substrate with the transparent conductive film. A solar cell 100C (100) shown in FIG. 2B is different from the configuration shown in FIG. 1 in that a non-film formation region X is provided near the back surface 101b of the base body 101.

Specifically, the transparent conductive film 104 is formed on the top surface 101a which is a light incidence side so as to coat the entire surface of the p-type a-Si film 103. On the other hand, on the back surface 101b which is a non-light incidence side, the transparent conductive film 114 is formed on the n-type a-Si film 113 so that part (outer-periphery) of the n-type a-Si film 113 is exposed. The portion at which the n-type a-Si film 113 is exposed is a non-film formation region X on which the transparent conductive film 114 is not formed.

By forming the non-film formation region X on a substrate 10C (10) with a transparent conductive film forming the solar cell 100C (100), it is possible to reliably prevent electrical short-circuiting between the transparent conductive film 104 which is formed on the light incidence side and the transparent conductive film 114 which is formed on the non-light incidence side.

(Modified Example 2 of Substrate with Transparent Conductive Film and Solar Cell Including Substrate with Transparent Conductive Film)

FIG. 2C is a cross-sectional view showing a modified example 2 of the substrate with the transparent conductive film and the solar cell including the substrate with the transparent conductive film. A solar cell 100D (100) shown in FIG. 2C is different from the configuration shown in FIG. 2B in that a p-type a-Si film is provided on the i-type a-Si film 112 and an n-type a-Si film is provided on the i-type a-Si film 102.

Specifically, on the top surface 101a which is a light incidence side, an n-type a-Si film 303 is formed on the i-type a-Si film 102 that is provided on and in touch with the top surface 101a, and the transparent conductive film 104 is formed so as to coat the entire surface of the n-type a-Si film 303. On the other hand, on the back surface 101b which is a non-light incidence side, a p-type a-Si film 313 is formed on the i-type a-Si film 112 that is provided on and in touch with the back surface 101b, and the transparent conductive film 114 is formed of the p-type a-Si film 313 so that part (outer-periphery) of the p-type a-Si film 313 is exposed. The portion at which the p-type a-Si film 313 is exposed is a non-film formation region X on which the transparent conductive film 114 is not formed.

The substrate 10D (10) with a transparent conductive film forming the solar cell 100D has a rear emitter structure in which the n-type a-Si film 303 is located at the light incidence side (light-receiving face side).

Similar to the solar cell of the modified example 1, by forming the non-film formation region X on the substrate 10D (10) with a transparent conductive film, it is possible to reliably prevent electrical short-circuiting between the transparent conductive film 104 which is formed on the light incidence side and the transparent conductive film 114 which is formed on the non-light incidence side.

Next, a step of forming the non-film formation region on the substrate with the transparent conductive film shown in FIGS. 2B and 2C will be described with reference to FIG. 2D.

As shown in FIG. 2D, the base body 101 on which the a-Si films (α, β) are formed is supported by a holder 400. Particularly, the holder 400 includes a holder body 401 and a protruding portion 402 that protrudes from the holder body 401. The protruding portion 402 shields the outer-periphery of the a-Si film (β). The region surrounded by the end face 403 of the protruding portion 402 is an opening 404 of the holder 400. The outer-periphery of the a-Si film (β) formed on the back surface 101b is in contact with the protruding portion 402 due to the action of own weight of the base body 101, and the base body 101 is thereby supported by the holder 400. The base body 101 supported by the holder 400 is horizontally transferred in a first film formation chamber 754 and a second film formation chamber 755 by a transfer mechanism 750 of a manufacturing apparatus 700 which will be described later, and film formation is carried out in the first film formation chamber 754 and the second film formation chamber 755.

In a state where the base body 101 is supported by the holder 400 in the above-described manner, since the outer-periphery of the a-Si film (β) of the base body 101 is covered (masked) with the protruding portion 402, the outer-periphery of the a-Si film (β) is not exposed to a film formation space of the film formation chamber located under the holder 400. On the other hand, the a-Si film (β) of the base body 101 which is not covered with the protruding portion 402 is exposed through the opening 404 of the holder 400 to a film formation space of the film formation chamber located under the holder 400. In addition, the entire surface of the a-Si film (a) of the base body 101 is not covered with the protruding portion 402 but is exposed to the film formation space of the film formation chamber.

In the first film formation chamber 754 and the second film formation chamber 755 of the manufacturing apparatus 700, when the transparent conductive film is formed on the base body 101 on which the a-Si films (α, β) are formed, the transparent conductive film 104 is formed on the entire surface of the a-Si film (a) (deposition down), and a transparent conductive film is not formed on the outer-periphery of the a-Si film (β). On the other hand, the transparent conductive film 114 is formed on the region of the a-Si film (β) corresponding to the opening 404 of the holder 400 (deposition up). Therefore, the non-film formation region X is formed without forming the transparent conductive film 114 on the outer-periphery of the a-Si film (β).

Particularly, the transparent conductive film provided on the light incidence side (light-receiving face side) exhibits an antireflection effect, and therefore incorporation of light as much as possible is effective to improve cell capability. Consequently, it is important to form a film on the entire surface of the a-Si film (α) by deposition down.

Since the transparent conductive films 104 and 114 are formed on the a-Si films (α, β) provided on both surfaces of the base body 101, the base body 101 is not subjected to an air atmosphere while a vacuum state is maintained, it is possible to form the transparent conductive film on the a-Si films (α, β) (consistent film formation on top and back surfaces in vacuum). In the case where a foundation is an a-Si film, in order to more effectively obtain an antireflection effect by use of the transparent conductive film, it is more preferable to control a film thickness of the transparent conductive film to be 60 to 120 (nm) and control a refractive index to be 1.9 to 2.1.

Furthermore, by use of the holder 400 having a simple structure, that is, the holder 400 having the protruding portion 402, it is possible to easily form the non-film formation region X on the substrates 10C and 10D with the transparent conductive film, and it is possible to reliably and easily prevent electrical short-circuiting between the transparent conductive film 104 and the transparent conductive film 114.

Third Embodiment

Figure 3:
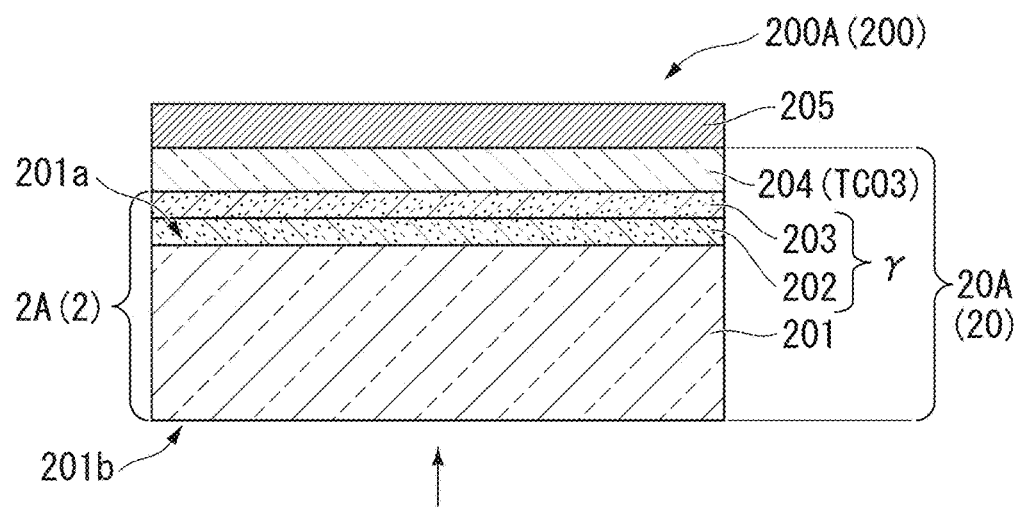
FIG. 3 is a cross-sectional view showing an example of the substrate with the transparent conductive film and a photodetector including the substrate with the transparent conductive film.

FIG. 3 is a cross-sectional view showing an example (third embodiment) of the substrate with the transparent conductive film and a photodetector including the substrate with the transparent conductive film. In FIG. 3, a base body 201 constituting a substrate 20A (20) with a transparent conductive film is a flat plate-shaped base member, one surface 201a of surfaces of the base body 201 (top surface) is coated with the a-Si film, and the other surface 201b (back surface) is in a state of being exposed. As the flat plate-shaped base member, a transparent base member is adopted such as glass, plastic, resin, or the like, as well as a crystalline silicon substrate. Since an action and an effect of the invention which will be described later do not depend on transparency of the base member, the invention is also applicable to an opaque base member. In FIG. 3, the arrow (upward direction) directed to the back surface 201b of the base body 201 represents a light incident direction.

Hereinbelow, a structure having an a-Si film (γ) which is provided on the base body 201 is referred to as an intermediate structure 2A (2). The structure in which a transparent conductive film 204 is provided on the intermediate structure 2A (2) is the substrate 20A (20) with the transparent conductive film. Moreover, the structure is a photodetector 200A (200) in which a transparent base member is used as the base body 201 and an optical film 205 having a light receiving function described later is provided on the substrate 20A (20) with the transparent conductive film.

The back surface 201b which is a light incidence side is basically used in a state of being exposed; however, the configuration in which an antireflection layer (Anti Reflection Layer: AR layer) which is not shown in the figure is disposed near the back surface 201b may be adopted as necessary. As the antireflection layer (not shown in the figure), for example, an insulating nitride film, a silicon nitride film, a titanium oxide film, an aluminum oxide coating, or the like is preferably used.

In contrast, the a-Si film (in FIG. 3, represented as γ) disposed on the top surface 201a which is a non-light incidence side is configured of an i-type a-Si film 202 that is provided on and in touch with the top surface 201a and a p-type a-Si film 203 that is provided on the i-type a-Si film 202. Additionally, the transparent conductive film 204 is provided so as to coat the p-type a-Si film 203 forming the outer surface of the a-Si film (γ). Furthermore, the optical film 205 having a light receiving function is disposed on the outer surface of the transparent conductive film 204.

The optical film 205 shown in FIG. 3 receives light that passes through the a-Si film (γ) and the transparent conductive film 204. As long as the transparent conductive film 204 is formed by the manufacturing method according to the embodiment of the invention, the transparent conductive film can provide a high degree of transmissivity also in a near infrared region in addition to a visible range. Accordingly, the photodetector 200A can utilize the light receiving function of the optical film 205 in a range of a visible range to a near infrared region.

Fourth Embodiment

Figure 4:
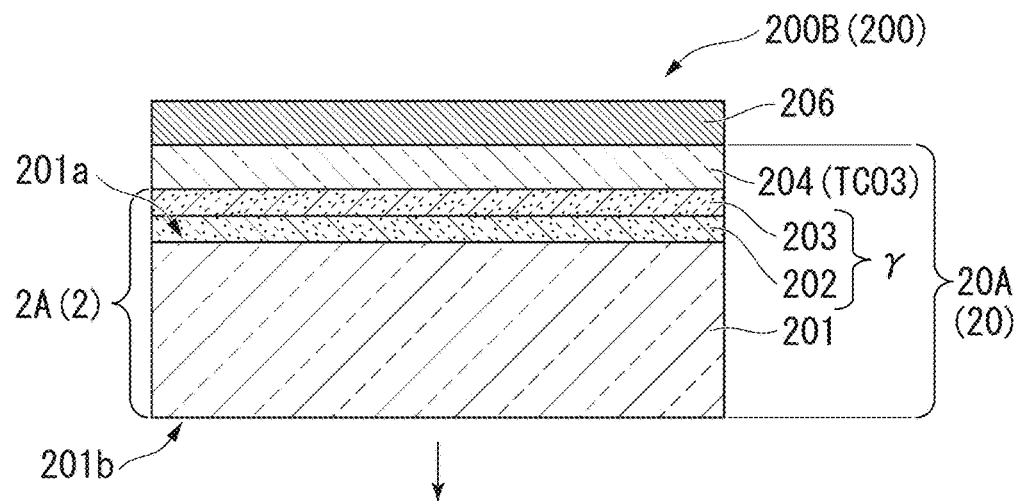
FIG. 4 is a cross-sectional view showing other example of the substrate with the transparent conductive film and the photodetector including the substrate with the transparent conductive film.

FIG. 4 is a cross-sectional view showing other example (fourth embodiment) of the substrate with the transparent conductive film and the photodetector including the substrate with the transparent conductive film. The photodetector 200B (200) shown in FIG. 4 is different from the photodetector 200A (200) shown in FIG. 3 in that an optical film 206 having a light emitting function is provided instead of the optical film 205 having a light receiving function.

In FIG. 4, in the case where light emitted from the optical film 206 is to be guided to the outside, the light is necessary to pass through the transparent conductive film 204, a-Si film (γ), and the base body 201. As long as the transparent conductive film 204 is formed by the manufacturing method according to the embodiment of the invention, the transparent conductive film can provide a high degree of transmissivity also in a near infrared region in addition to a visible range. Accordingly, the photodetector 200B can utilize the light emitting function of the optical film 206 in a range of a visible range to a near infrared region.

Fifth Embodiment

Figure 5:
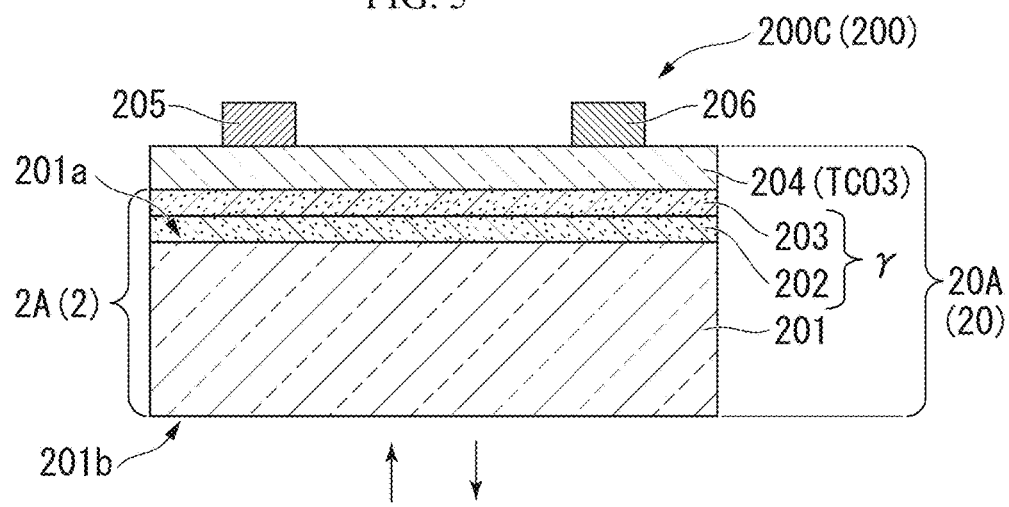
FIG. 5 is a cross-sectional view showing other example of the substrate with the transparent conductive film and the photodetector including the substrate with the transparent conductive film.

FIG. 5 is a cross-sectional view showing other example (fifth embodiment) of the substrate with the transparent conductive film and the photodetector including the substrate with the transparent conductive film. A photodetector 200C (200) shown in FIG. 5 includes two optical films 205 and 206 on the transparent conductive film 204 and therefore has both the functions of the aforementioned two photodetectors 200A and 200B. Consequently, the photodetector 200C can utilize both the light receiving function of the optical film 205 in a range of a visible range to a near infrared region and the light emitting function of the optical film 206.

For this reason, according to the embodiment of the invention, in the case (FIGS. 3 to 5) of using a flat plate-shaped transparent base member as a base body having one surface which is coated with the a-Si film, near-infrared light in addition to visible light can be effectively utilized for power generation. Therefore, it is possible to provide a substrate with a transparent conductive film which is preferably used for a photodetector that can carry out excellent sensing in a wavelength region wider than in a conventional case.

Moreover, according to the invention, since the transparent conductive film has a flat surface profile, improvement in electrical contact between the optical film that is in contact with the transparent conductive film and the transparent conductive film is achieved. Therefore, it is possible to obtain a photodetector having high sensitivity even for slight light.

(Method of Manufacturing Substrate with Transparent Conductive Film)

Hereinbelow, a method of manufacturing a substrate with a transparent conductive film (and a solar cell including a substrate with a transparent conductive film) according to the first embodiment of the invention will be described.

The method of manufacturing a substrate with a transparent conductive film according to the first embodiment of the invention is a method which manufactures a substrate with a transparent conductive film so that, on a base body on which both or one of a top surface and a back surface are coated with an a-Si film, the transparent conductive film is disposed so as to coat the a-Si film. At this time, in a film-formation space having a processing gas containing hydrogen, sputtering is carried out by applying a sputtering voltage to a target that forms a base material used to form the transparent conductive film, temperatures of the base body and the a-Si film are set in 70 to 220° C., and the transparent conductive film is formed on the a-Si film (Step A).

(Sputtering Apparatus)

In the aforementioned method of manufacturing the substrate with the transparent conductive film (and the solar cell), the a-Si films ($\alpha$, $\beta$) corresponding to a foundation of the transparent conductive film shown in FIG. 1 is formed on the base body 101 by a known chemical vapor deposition apparatus. Here, the transparent conductive films (TCO1, TCO2) can be formed by a manufacturing apparatus 700 (hereinbelow, also referred to as a sputtering apparatus) that is shown in, for example, FIG. 8A and carries out film formation using a DC sputtering method. The manufacturing apparatus 700 is an in-line sputtering apparatus and is a horizontal-transfer sputtering apparatus including a transfer mechanism that horizontally holds and transfers the base body 101.

Figure 8A:
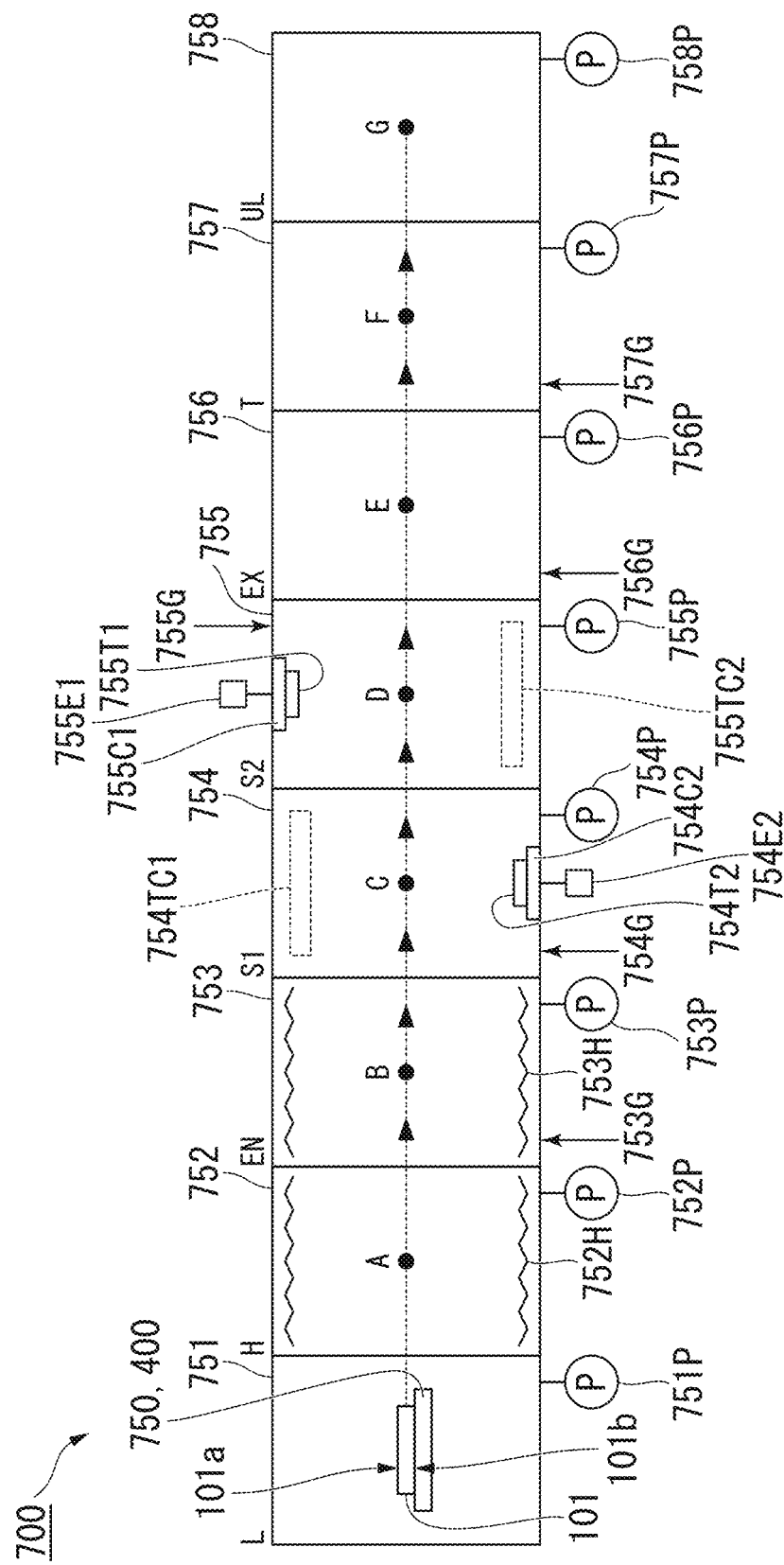
FIG. 8A is a schematic diagram showing a manufacturing apparatus of a substrate with a transparent conductive film.

In the sputtering apparatus 700 shown in FIG. 8A, a plurality of processing chambers are arranged and connected in series, a tray (not shown in the figure) on which the base body 101 having the a-Si films ($\alpha$, $\beta$) formed thereon, that is, the intermediate structure 1A (1) is mounted sequentially passes through the processing chambers, and the transparent conductive film according to the embodiment of the invention is thereby formed on the intermediate structure 1A (1). Note that, the tray may be the holder 400 shown in FIG. 2D.

The sputtering apparatus 700 includes a load chamber (L) 751, a heating chamber (H) 752, a film-formation entrance chamber (EN) 753, a first film formation chamber (S1) 754, a second film formation chamber (S2) 755, a film formation exit chamber (EX) 756, a transfer chamber (T) 757, and an unload chamber (UL) 758. Furthermore, the sputtering apparatus 700 includes a transfer mechanism 750 that transfers the intermediate structure 1A (1) from the load chamber (L) 751 to the unload chamber (UL) 758 while horizontally holding the intermediate structure 1A (1).

By a known chemical vapor deposition apparatus, an a-Si film is formed in advance on both the top surface and the back surface of the intermediate structure 1A (1) which is mounted on the tray (not shown in the figure) that is transferred from the load chamber (L) 751. The intermediate structure 1A (1) can be transferred from the load chamber (L) 751 to the unload chamber (UL) 758 only in the forward direction in a state of being mounted on the tray (not shown in the figure). That is, in the manufacturing apparatus 700 shown in FIG. 8A, the intermediate structure 1A (1) which is mounted on the tray (not shown in the figure) is not necessary to return in the backward direction (in a direction from the unload chamber (UL) 758 to the load chamber (L) 751). Consequently, the manufacturing apparatus 700 shown in FIG. 8A is excellent for use in mass production.

The intermediate structure 1A (1) which is transferred to the load chamber 751 is transferred from the load chamber 751 to the heating chamber 752 after the load chamber 751 is in a desired reduced-pressure atmosphere, and is subjected to heat-treatment by a heater 752H at the point A. The intermediate structure 1A (1) having a desired temperature is transferred to the film-formation entrance chamber 753, an atmosphere of the film-formation entrance chamber 753 in which the intermediate structure 1A (1) is accommodated is adjusted to correspond to an atmosphere and conditions where a transparent conductive film is formed in a subsequent first film formation chamber 754. The film-formation entrance chamber 753 includes a heater 753H and adjusts a temperature of the intermediate structure 1A (1), that is, a temperature of the a-Si film formed on both the top surface and the back surface of the base body 101 so as to be a preferable for forming a transparent conductive film (point B). In other words, the film-formation entrance chamber 753 functions as a heating chamber.

Subsequently, the intermediate structure 1A (1) having an adjusted temperature is transferred to the first film formation chamber 754 and passes through the point C. At this time, the transfer mechanism 750 horizontally holds the intermediate structure 1A (1) (base body) so that the intermediate structure 1A (1) (base body) faces a target 754T2. As the intermediate structure 1A (1) passes through the point C by the transfer mechanism 750, a transparent conductive film (114) is formed only on one of the surfaces of the intermediate structure 1A (1) by a DC sputtering method using the target 754T2. For this reason, the transparent conductive film (114) is formed on the a-Si film ($\beta$) near one surface (101$b$) of the base body 101. Here, the target 754T2 is mounted on a cathode 754C2, and a power supply 754E2 is connected to the cathode 754C2. In the first film formation chamber 754, the target 754T2 and the cathode 754C2 are disposed under the base body 101, and sputtering due to deposition up is carried out.

Next, as the intermediate structure 1A (1) on which the transparent conductive film (114) is formed is transferred to the second film formation chamber 755 and passes through the point D), the transparent conductive film (104) is formed only on the other of the surfaces of the intermediate structure 1A (1) by a DC sputtering method using a target 755T1. For this reason, the transparent conductive film (104) is formed on the a-Si film ($\alpha$) near the other surface (101$a$) of the base body 101, and the substrate 10A (10) with the transparent conductive film according to the embodiment of the invention is obtained. Here, the target 755T1 is mounted on a cathode 755C1, and a power supply 755E1 is connected to the cathode 755C1. In the second film formation chamber 755, the target 755T1 and the cathode 755C1 are disposed above the base body 101, and sputtering due to deposition down is carried out.

When the transparent conductive film (104) is formed in the first film formation chamber 754 and when the transparent conductive film (114) is formed in the second film formation chamber 755, temperatures of the a-Si films (α, β) serving as a foundation thereof may be adjusted so as to be a preferable for forming a transparent conductive film by use of each of temperature control devices 754TC1 and 755TC2.

The intermediate structure 1A (1) on which the transparent conductive films (104, 114) are formed is transferred to the film formation exit chamber 756 (point E), is thereafter transferred to the unload chamber 758 (point F), and is transferred to the outside of the sputtering apparatus in a state where an internal pressure of the unload chamber 758 is an atmospheric pressure (point G).

Between the first film formation chamber 754 and the second film formation chamber 755 in the sputtering apparatus 700, it is preferable to separate the atmospheres of both film formation chambers from each other and so as to be able to maintain independent atmosphere. For example, a gate valve, a door valve, a differential valve, or the like is provided between two film formation chambers. As a result, there is no possibility that oxygen generated from the first film formation chamber 754 flows to an internal space of the second film formation chamber 755 or there is no possibility that oxygen from the second film formation chamber 755 flows to an internal space of the first film formation chamber 754, and a problem is solved in that oxygen that flows from other film formation chambers is incorporated into the inside of the transparent conductive films (TCO1, TCO2). Consequently, there is no possibility that the composition of the transparent conductive film is out from a desired composition, and it is possible to achieve a transparent conductive film having stable electrical characteristics and optical properties. According to the sputtering apparatus 700 shown in FIG. 8A, even where processing chambers (the heating chamber 752 or the film-formation entrance chamber 753) which carry out heat-treatment before or after forming transparent conductive films (TCO1, TCO2) are disposed, since manufacturing efficiency is maintained, it is possible to achieve reduction in the cost of manufacturing. Furthermore, a temperature control chamber that is used to adjust a temperature of the intermediate structure 1A (1), that is, the a-Si film may be provided between the first film formation chamber 754 and the second film formation chamber 755. As a result of providing the temperature control chamber as described above, between the first film formation chamber 754 and the second film formation chamber 755, it is possible to separate the atmospheres of both film formation chambers from each other.

Additionally, since the manufacturing apparatus 700 is an in-line sputtering apparatus, it is possible to manufacture a substrate with a transparent conductive film (and solar cell) with a high degree of productivity, and there is an advantage in that it is possible to reduce a footprint of the apparatus. Moreover, in the case of an in-line sputtering apparatus, it is suitable for manufacturing a uniform film under the same conditions for film formation.

In contrast, in the case of using a common single wafer type manufacturing apparatus, for each time of processing one substrate, it is necessary to extract a substrate (post-film formation substrate) on which a film is formed in advance from a film formation chamber to a transferring chamber (transfer chamber), and it is necessary to transfer a substrate (pre-film formation substrate) on which a film is to be subsequently formed from the transfer chamber to the film formation chamber. In addition, after the post-film formation substrate is extracted, it is necessary to cause the inside of the film formation chamber to be in a clean state by removing a remaining gas present in the film formation chamber, and thereafter it is necessary transfer the pre-film formation substrate to the inside of the film formation chamber. However, in this case, the remaining component is not completely removed from the film formation chamber due to adhesion or the like of a remaining component of the remaining gas to a wall or the like of the film formation chamber, and there is a concern that the remaining component affects characteristics of the film which is to be formed later. Furthermore, when forming a film on a substrate, introduction of a processing gas and stopping of introduction of a processing gas are carried out in the film formation chamber, and turning on and off electric discharge is carried out. In this case, for each time of processing one substrate, it is necessary to control an adsorbed amount of water with respect to a base film, and processing therefor is likely to be difficult.

In contrast, in the case of using the in-line sputtering apparatus, since the transparent conductive films 104 and 114 are formed on the a-Si films (α, β) provided on both surfaces of the base body 101 while the base body 101 is transferred only in the forward direction from the load chamber (L) 751 toward the unload chamber (UL) 758 and passes through the inside of the manufacturing apparatus 700, there is an advantage in that control of an adsorbed amount of water with respect to a-Si film serving as a base film becomes simple. Moreover, since power supply is always turned ON, time that contributes to film formation is 100%, it is possible to achieve both a high degree of productivity and a low running cost.

In addition, in the manufacturing apparatus 700, since transparent conductive films are formed on the a-Si films (α, β) provided on both surfaces of the base body 101 in the first film formation chamber 754 and the second film formation chamber 755, the base body 101 is not subjected to an air atmosphere while a vacuum state is maintained, it is possible to form the transparent conductive film on the a-Si films (α, β) provided on both surfaces of the base body 101 (consistent film formation on top and back surfaces in vacuum).

Note that, in the case of forming a film on both surfaces of a substrate in a common film formation apparatus, after a film is formed on one of the surfaces of the substrate, the substrate is extracted from the film formation chamber and is subjected to an air atmosphere, a robot flips the substrate, the substrate is transferred to the film formation chamber, and a film is formed on the other of the surfaces of the substrate. In this case, as the substrate is subjected to the air atmosphere, an a-Si film is oxidized, and there is a concern that characteristics of a cell become degraded.

In contrast, in the manufacturing apparatus 700, since transparent conductive films are formed on the a-Si films (α, β) provided on both surfaces of the base body 101 while a vacuum atmosphere is maintained, the a-Si films (α, β) are not oxidized, and it is possible to obtain stable characteristics of a cell. Furthermore, the frequency of introduction, into a film formation apparatus, of air which was adsorbed to the base body 101 when the base body is subjected to an air atmosphere, that is, an absolute amount thereof air is reduced, and therefore contamination with respect to the film formation apparatus due to a processing gas is reduced.

In the case of forming the solar cell such as shown in FIG. 1 or FIGS. 2A to 2C, as a patterned metal film is formed on each of the transparent conductive films (104, 114) forming the substrate 10A (10) with the transparent conductive film by forming a desired metal film and carrying out patterning or by a printing method using silver paste or the like, the solar cell 100A (100) including the electrodes (105, 115) is obtained. In the case of forming the solar cell 100A (100), a crystalline silicon base member formed in a flat-plate shape is used as a base body having both the top surface and the back surface which are coated with an a-Si film.

In contrast, in the case of use for various light-receiving-emitting photodetectors, display panels, or the like such as shown in FIGS. 3 to 5, it is only necessary to control the sputtering apparatus 700 so that one surface of the base body is configured to be coated with the a-Si film, that is, so that a film is only formed on one surface of the base body. In the above-described case, a transparent insulative base member which is made of glass or resin as well as a crystalline silicon substrate is used as the base body 101.

Next, a modified example 1 of a sputtering apparatus will be described with reference to FIG. 8B. In FIG. 8B, identical reference numerals are used for the elements which are identical to those of the sputtering apparatus 700 shown in FIG. 8A, and the explanations thereof are omitted or simplified here. Particularly, in the configurations of the first film formation chamber 754 and the second film formation chamber 755, the sputtering apparatus shown in FIG. 8B is different from the sputtering apparatus shown in FIG. 8A. In the following explanation, the difference of a sputtering apparatus from FIG. 8A will be specifically described.
(Modified Example 1 of Sputtering Apparatus)

FIG. 8B is a view showing a modified example 1 of the above-mentioned sputtering apparatus and is a schematic diagram showing the configurations of the first film formation chamber 754 and the second film formation chamber 755 which are described above. The first film formation chamber 754 is constituted of a first sputtering chamber 754A and a second sputtering chamber 754B. The second film formation chamber 755 is constituted of a third sputtering chamber 755A and a fourth sputtering chamber 755B. In other words, the modified example 1 of the sputtering apparatus is achieved by replacing the first film formation chamber 754 with the first sputtering chamber 754A and the second sputtering chamber 754B and by replacing the second film formation chamber 755 with the third sputtering chamber 755A and the fourth sputtering chamber 755B.

It is preferable that a gate valve (a gate valve, a door valve, a differential valve, or the like) which is not shown in the figure be provided between the first sputtering chamber 754A and the second sputtering chamber 754B, between the second sputtering chamber 754B and the third sputtering chamber 755A, and between the third sputtering chamber 755A and the fourth sputtering chamber 755B. Note that, in FIG. 8B, an exhaust device that reduces pressures of the sputtering chambers 754A, 754B, 755A, and 755B and a power supply that supplies electric power to a cathode are omitted.

The first sputtering chamber 754A includes two cathodes and two targets, that is, a cathode C2A, a target T2A mounted on the cathode C2A, a cathode C2B, and a target T2B mounted on the cathode C2B. Additionally, the first sputtering chamber 754A includes temperature control devices TC and TC1B.

Furthermore, the first sputtering chamber 754A includes water vapor ($H_2O$) supply ports A and B (processing gas introduction mechanism) that supply water vapor ($H_2O$) to the inside of the first sputtering chamber 754A. The water vapor ($H_2O$) supply ports A and B are configured to be able to supply water vapor ($H_2O$) to the upstream side of the cathode C2A (the target T2A) and the upstream side of the cathode C2B (the target T2B) in a transfer direction of the base body 101 in the first sputtering chamber 754A.

The second sputtering chamber 754B includes two cathodes and two targets, that is, a cathode C2C, a target T2C mounted on the cathode C2C, a cathode C2D, and a target T2D mounted on the cathode C2D. Additionally, the second sputtering chamber 754B includes temperature control devices TC and TC1D.

Furthermore, the second sputtering chamber 754B includes water vapor ($H_2O$) supply ports C and D (processing gas introduction mechanism) that supply water vapor ($H_2O$) to the inside of the second sputtering chamber 754B. The water vapor ($H_2O$) supply ports C and D are configured to be able to supply water vapor ($H_2O$) to the upstream side of the cathode C2C (the target T2C) and the upstream side of the cathode C2D (the target T2D) in a transfer direction of the base body 101 in the second sputtering chamber 754B.

Note that, the function of the cathodes C2A, C2B, C2C, and C2D in the first sputtering chamber 754A and the second sputtering chamber 754B is the same as that of the aforementioned cathode 754C2. The function of the targets T2A, T2B, T2C, and T2D is the same as that of the aforementioned target 754T2. The function of the temperature control devices TC1A, TC1B, TC1C, and TC1D is the same as that of the aforementioned temperature control device 754TC1.

The third sputtering chamber 755A includes two cathodes and two targets, that is, a cathode CIA, a target T1A mounted on the cathode C1A, a cathode C1B, and a target T1B mounted on the cathode C1B. Additionally, the third sputtering chamber 755A includes temperature control devices TC2A and TC2B.

Furthermore, the third sputtering chamber 755A includes water vapor ($H_2O$) supply ports E and F (processing gas introduction mechanism) that supply water vapor ($H_2O$) to the inside of the third sputtering chamber 755A. The water vapor ($H_2O$) supply ports E and F are configured to be able to supply water vapor ($H_2O$) to the upstream side of the cathode CIA (the target T1A) and the upstream side of the cathode C1B (the target T1B) in a transfer direction of the base body 101 in the third sputtering chamber 755A.

The fourth sputtering chamber 755B includes two cathodes and two targets, that is, a cathode C1C, a target T1C mounted on the cathode C1C, a cathode C1D, and a target T1D mounted on the cathode C1D. Additionally, the fourth sputtering chamber 755B includes temperature control devices TC2C and TC2D.

Furthermore, the fourth sputtering chamber 755B includes water vapor ($H_2O$) supply ports G and H (processing gas introduction mechanism) that supply water vapor ($H_2O$) to the inside of the fourth sputtering chamber 755B. The water vapor ($H_2O$) supply ports G and H are configured to be able to supply water vapor ($H_2O$) to the upstream side of the cathode C1C (the target T1C) and the upstream side of the cathode CID (the target T1D) in a transfer direction of the base body 101 in the fourth sputtering chamber 755B.

Note that, the function of the cathodes C1A, C1B, C1C, and CM in the third sputtering chamber 755A and the fourth sputtering chamber 755B is the same as that of the aforementioned cathode 755C1. The function of the targets T1A, T1B, TIC, and T1D is the same as that of the aforementioned target 755T1. The function of the temperature control devices TC2A, TC2B, TC2C, and TC2D is the same as that of the aforementioned temperature control device 755TC2.

The water vapor ($H_2O$) supply ports A to H are connected to, for example, a pipe that extends in a longitudinal direction of the target (for example, in a paperface depth direction in FIG. 8B) in the sputtering chamber. Moreover, a plurality of gas supply holes are provided on the pipe, and water vapor is supplied from the water vapor ($H_2O$) supply port to the inside of the sputtering chamber through the plurality of gas supply holes. It is preferable that the position at which water vapor is supplied in the sputtering chamber be, for example, a discharge space between the target and the base body 101, and the position is preferably a position close to the target (the position is close to the position at which sputtering is carried out).

According to the above-described configuration, it is possible to evenly supply water vapor to the transparent conductive films formed on the a-Si films ($\alpha$, $\beta$).

An argon gas supply port that supplies argon (Ar) as an atmosphere gas to the inside of the sputtering chamber and an oxygen gas supply port that supplies oxygen ($O_2$) to the inside of the sputtering chamber are provided in the sputtering chambers 754A, 754B, 755A, and 755B.

The argon gas supply port is provided in each sputtering chamber at the position close to the water vapor ($H_2O$) supply ports A to H and is provided at, for example, at a plurality of positions (a plurality of points). Note that, since the argon gas supply port is only necessary to supply argon for forming a sputtering atmosphere, one port is provided for each sputtering chamber and a large amount argon may be supplied from this one port.

The oxygen gas supply port is provided at the position close to the water vapor ($H_2O$) supply ports A to H. Note that, since the supplying position of an oxygen gas in each sputtering chamber affects a plasma profile, a gas flow profile, characteristics of a film to be formed, or the like, the position is appropriately adjusted. For example, divided pipes that supply an oxygen gas from a plurality of positions are connected to the oxygen gas supply port, and oxygen may be supplied through the divided pipes from a plurality of positions in the sputtering chamber.

Note that, a mixed gas containing an oxygen gas and water vapor may be supplied to the inside of the sputtering chamber from the water vapor ($H_2O$) supply ports A to H without providing the oxygen gas supply port.

Next, operations of the first sputtering chamber 754A, the second sputtering chamber 754B, the third sputtering chamber 755A, and the fourth sputtering chamber 755B will be described. Particularly, in the following operations, the case of carrying out sputtering by supplying water vapor from the water vapor ($H_2O$) supply port to the inside of the sputtering chamber in a state where an argon gas and an oxygen gas are supplied to the inside of the sputtering chamber will be described.

In the sputtering apparatus including the aforementioned structure, the base body 101 having the a-Si films ($\alpha$, $\beta$) formed thereon is transferred in a direction from the point B to the point E.

Firstly, in the process in which the base body 101 moves from the point B to the point C1 in the first sputtering chamber 754A, the transparent conductive film 114 is formed on the a-Si film ($\beta$) on one surface (101b) of the base body 101 by a DC sputtering method using the targets T2A and T2B.

At this time, when the base body 101 passes through the position corresponding to the target T2A and the transparent conductive film 114 is thereby formed on the a-Si film ($\beta$), firstly, water vapor is supplied from the water vapor ($H_2O$) supply port A to the upstream side of the target T2A. For this reason, an initial layer (hereinbelow, simply referred to as an initial layer of the transparent conductive film 114 or an initial layer) which is initially formed by the process of forming the transparent conductive film 114 by the target T2A contains a large amount of hydrogen. Furthermore, the initial layer functions as an underlying layer, growth of the transparent conductive film proceeds, and the transparent conductive film is formed on the a-Si film.

Similarly, when the base body 101 passes through the position corresponding to the target T2B and the transparent conductive film 114 is formed on the a-Si film ($\beta$), firstly, water vapor is supplied from the water vapor ($H_2O$) supply port B to the upstream side of the target T2B. For this reason, by the target T2B, an initial layer of the transparent conductive film 114 contains a large amount of hydrogen. Furthermore, the initial layer functions as an underlying layer, growth of the transparent conductive film proceeds, and the transparent conductive film is formed on the a-Si film.

Furthermore, in the process in which the base body 101 moves from the first sputtering chamber 754A to the point C2 in the second sputtering chamber 754B, the transparent conductive film 114 is formed on the a-Si film ($\beta$).

At this time, when the base body 101 passes through the position corresponding to the target T2C and the transparent conductive film 114 is formed on the a-Si film ($\beta$), firstly, water vapor is supplied from the water vapor ($H_2O$) supply port C to the upstream side of the target T2C. For this reason, by the target T2C, an initial layer of the transparent conductive film 114 contains a large amount of hydrogen. Furthermore, the initial layer functions as an underlying layer, growth of the transparent conductive film proceeds, and the transparent conductive film is formed on the a-Si film. In addition, also in the case of film formation by the target T2D, as the water vapor ($H_2O$) supply port D supplies water vapor, an initial layer of the transparent conductive film 114 by the target T2D contains a large amount of hydrogen. Furthermore, the initial layer functions as an underlying layer, growth of the transparent conductive film proceeds, and the transparent conductive film is formed on the a-Si film. After the above-described processes are carried out, the transparent conductive film 114 is formed on the a-Si film ($\beta$) by deposition up.

Subsequently, the base body 101 having the transparent conductive film 114 formed on the a-Si film ($\beta$) moves from the second sputtering chamber 754B to the point D1 in the third sputtering chamber 755A. In this process, the transparent conductive film 104 is formed on the a-Si film ($\alpha$) near the other surface (101a) of the base body 101 by a DC sputtering method using the targets T1A and T1B.

At this time, when the base body 101 passes through the position corresponding to the target T1A and the transparent conductive film 104 is thereby formed on the a-Si film ($\alpha$), firstly, water vapor is supplied from the water vapor ($H_2O$) supply port E to the upstream side of the target T1A. For this reason, an initial layer (hereinbelow, simply referred to as an initial layer of the transparent conductive film 104 or an initial layer) which is initially formed by the process of forming the transparent conductive film 104 by the target T1A contains a large amount of hydrogen. Furthermore, the initial layer functions as an underlying layer, growth of the transparent conductive film proceeds, and the transparent conductive film is formed on the a-Si film.

Similarly, when the base body 101 passes through the position corresponding to the target T1B and the transparent conductive film 104 is formed on the a-Si film ($\alpha$), firstly, water vapor is supplied from the water vapor ($H_2O$) supply port F to the upstream side of the target T1B. For this reason, by the target T1B, an initial layer of the transparent conductive film 104 contains a large amount of hydrogen. Furthermore, the initial layer functions as an underlying layer, growth of the transparent conductive film proceeds, and the transparent conductive film is formed on the a-Si film.

Furthermore, in the process in which the base body 101 moves from the third sputtering chamber 755A to the point D2 in the fourth sputtering chamber 755B, the transparent conductive film 104 is formed on the a-Si film (α).

At this time, when the base body 101 passes through the position corresponding to the target T1C and the transparent conductive film 104 is formed on the a-Si film (α), firstly, water vapor is supplied from the water vapor ($H_2O$) supply port G to the upstream side of the target T1C. For this reason, by the target T1C, an initial layer of the transparent conductive film 104 contains a large amount of hydrogen. Furthermore, the initial layer functions as an underlying layer, growth of the transparent conductive film proceeds, and the transparent conductive film is formed on the a-Si film. In addition, also in the case of film formation by the target T1D, as the water vapor ($H_2O$) supply port H supplies water vapor, an initial layer of the transparent conductive film 104 by the target T1D contains a large amount of hydrogen. Furthermore, the initial layer functions as an underlying layer, growth of the transparent conductive film proceeds, and the transparent conductive film is formed on the a-Si film. After the above-described processes are carried out, the transparent conductive film 104 is formed on the a-Si film (α) by deposition down.

According to the modified example 1 of the above-mentioned sputtering apparatus, the initial layer in which a large amount of hydrogen is contained functions as an underlying layer. Since the transparent conductive film formed by sputtering is significantly affected by foundation, it is possible to cause the transparent conductive film containing a large amount of hydrogen to be more effectively grown, and it is possible to form the transparent conductive film containing hydrogen on the a-Si films (α, β).

Note that, in the modified example 1 of the above-mentioned sputtering apparatus, the case where water vapor is supplied to the inside of the sputtering chamber from all of the water vapor ($H_2O$) supply ports A to H is described; however, supply of water vapor from all of the water vapor ($H_2O$) supply ports is not necessarily required. Water vapor may be supplied from only the water vapor ($H_2O$) supply ports which will be described below in modified examples 2 and 3.

(Modified Example 2 of Sputtering Apparatus)

(Supply of Water Vapor from Water Vapor ($H_2O$) Supply Ports a and E)

As described above, it is more effective for the transparent conductive films which are to be initially formed on the a-Si films (α, β) to contain hydrogen. In contrast, hydrogen does not necessarily have to be supplied to a transparent conductive film to be layered on the transparent conductive film which is formed in advance. Consequently, hydrogen is introduced into the films which are to be initially formed on the a-Si films (α, β) by supply of water vapor from the water vapor ($H_2O$) supply ports A and E, and water vapor does not necessarily have to be supplied from the water vapor ($H_2O$) supply ports B to D which are located further downstream side than the water vapor ($H_2O$) supply port A and from the water vapor ($H_2O$) supply ports F to H which are located further downstream side than the water vapor ($H_2O$) supply port E.

In this case, since the number of mechanisms that supply water vapor can be reduced, the cost of apparatus and the running cost can be reduced as compared with the modified example 1 of the above-mentioned sputtering apparatus.

(Modified Example 3 of Sputtering Apparatus)

(Supply of Water Vapor from Water Vapor ($H_2O$) Supply Ports B and F) It is necessary to for the transparent conductive films which are to be initially formed on the a-Si films (α, β) to contain hydrogen; on the other hand, it is preferable to prevent water vapor from being adhered to the base body 101. Particularly, in the case of supplying water vapor from the water vapor ($H_2O$) supply ports A and E, there is a concern that water vapor is adhered to the top surface 101a and the back surface 101b of the base body 101. Because of this, supply of water vapor from the water vapor ($H_2O$) supply ports B and F may be carried out without carrying out supply of water vapor from the water vapor ($H_2O$) supply ports A and E.

In this case, since the number of mechanisms that supply water vapor can be reduced, the cost of apparatus and the running cost can be reduced as compared with the modified example 1 of the above-mentioned sputtering apparatus; and a concentration profile of hydrogen contained in the transparent conductive film is excellent by supplying water vapor from between targets.

Note that, in the modified examples 1 to 3 of the above-mentioned sputtering apparatus, film formation conditions of the transparent conductive film 104 formed on the a-Si film (α) and the transparent conductive film 114 formed on the a-Si film (β) are not necessary to be the same as each other but may be different from each other.

For example, it is required that the characteristics necessary for the transparent conductive film 104 to be formed on the light incidence side (the top surface 101a) exhibit a high optical transparency and a low resistance. Consequently, by introduction of hydrogen into a transparent conductive film as described above, a transparent conductive film having a high mobility and a low carrier density is formed. On the other hand, since it is not required that the characteristics necessary for the transparent conductive film 114 to be formed on the non-light incidence side (the back surface 101b) exhibit a high optical transparency, the transparent conductive film 114 may be formed without introduction of hydrogen.

For this reason, in the sputtering apparatus shown in FIGS. 8A and 8B, without providing the water vapor ($H_2O$) supply ports in the first sputtering chamber 754A and the second sputtering chamber 754B, water vapor does not necessarily have to be supplied thereto when the transparent conductive film 114 is formed.

(Method of Manufacturing Substrate with Transparent Conductive Film)

Hereinbelow, as an example of a method of manufacturing a substrate with a transparent conductive film of the invention, a method of manufacturing the substrate 10A (10) with the transparent conductive film shown in FIG. 1 by use of the sputtering apparatus shown in FIG. 8A will be shown. Note that, the manufacturing method described below is also applicable to the sputtering apparatus shown in FIG. 8B.

As a target material used for manufacturing the transparent conductive films (TCO1, TCO2), stannum-doped indium oxide (ITO) is adopted in which 1 to 10 by mass of tin oxide is doped to indium oxide. Among ITOs, from the point where a thin film having a low specific resistance can be formed, ITO is preferable in which 5 to 10 by mass of tin oxide is doped to indium oxide.

For example, a base body 101 made of n-type crystalline silicon having a predetermined plate thickness and formed in a rectangular shape is prepared (S11 in FIG. 7B). Surfaces of a top surface and a back surface of the base body 101 are subjected to a desired texture treatment (S12 in FIG. 7B).

After a predetermined rinsing treatment and drying treatment are carried out, a-Si films (α, β) serving as a foundation of the transparent conductive film are formed on both the top surface and the back surface of the base body 101 by a known chemical vapor deposition apparatus. Thereafter, the base body 101 having the a-Si film formed thereon, that is, the intermediate structure 1A (1) is set on a tray (not shown in the figure) located in the load chamber 751 of the sputtering apparatus 700. After the pressure of the inside of the load chamber 751 is reduced until being a predetermined pressure by an exhaust device 751P, the intermediate structure 1A (1) is transferred from the load chamber 751 to the heating chamber 752 in which the pressure thereof is reduced. While maintaining the inside of the heating chamber 752 to be less than or equal to a predetermined degree of vacuum by an exhaust device 752P, the intermediate structure 1A (1) set on the tray (not shown in the figure) is heated until having a predetermined temperature by the heater 752H.

The intermediate structure 1A (1) that was heated until having a predetermined temperature is transferred to the film-formation entrance chamber 753, and heating is carried out by the heater 753H so that temperatures of the a-Si films (α, β) become a desired range (70 to 220° C.). Thereafter, the intermediate structure 1A (1) having the a-Si films (α, β) which are in a state of being heated and form outer surfaces thereof is transferred to the first film formation chamber 754. In the first film formation chamber 754, the transparent conductive film 104 (TCO1) is formed on the a-Si film (α) by a DC sputtering method using the target 754T2 made of ITO (S16 in FIG. 7B).

Subsequently, the intermediate structure 1A (1) having the transparent conductive film (104) formed on one surface of the intermediate structure 1A (1) is transferred to the second film formation chamber 755. In the second film formation chamber 755, the transparent conductive film 114 (TCO2) is formed on the a-Si film (β) by a DC sputtering method using the target 755T1 made of ITO (S16 in FIG. 7B).

In this situation, in the first film formation chamber 754 and the second film formation chamber 755, a gas containing hydrogen as a processing gas is introduced thereinto by processing gas introduction mechanisms 754G and 755G. In this case, water vapor ($H_2O$) may be added to an argon (Ar) gas, and a mixed gas of oxygen ($O_2$) and hydrogen ($H_2$) may be added to an argon gas. Furthermore, in addition to that oxygen and hydrogen are added to an argon gas, water vapor may be added thereto. Water vapor may be added to an argon gas and an oxygen gas. In addition, hydrogen may be introduced into a process atmosphere by causing water ($H_2O$) to be adsorbed and absorbed to a peripheral member of the base body such as the base body or the tray.

Thereafter, the electrodes 105 and 115 which are patterned and made of a metal film are formed on the transparent conductive film 104 (TCO1) and the transparent conductive film 114 (TCO2) by a predetermined film coating method (S17 in FIG. 7B). As a result, the solar cell 100A (100) according to the embodiment of the invention is obtained.

Here, in the case of using a printing method as a method of forming the metal films, that is, the electrodes 105 and 115, forming of an electrode that is patterned by using silver paste is common. In this case, removal of impurities included in the inside of the metal film and lowering of the resistance of the film are prompted by heating and baking the electrodes after the electrode is printed. Simultaneously, further-lowering of the resistances of the transparent conductive films 104 and 114 due to heating of the transparent conductive films 104 and 114 can be expected (Step B).

On the other hand, even in the case where a printing method is not selected, further-lowering of the resistance of the transparent conductive film due to heating after film formation is expected, and therefore heat-treatment (post-heating) may be carried out in a heating furnace after the transparent conductive film is formed (Step B). In the case where the formed transparent conductive film is subjected to heat-treatment as stated above, a heating temperature may be approximately 200° C., a process atmosphere may be under an atmospheric pressure or may be under a reduced pressure, and the process is carried out in a desired gas atmosphere.

Particularly, in order to evaluate a film quality and optical properties of the transparent conductive film according to the embodiment of the invention, a glass substrate (model number: Eagle XG produced by Corning Incorporated) is used as the base body 101, a substrate with a transparent conductive film was manufactured which is configured to include a transparent conductive film that is formed only on one surface of the base body 101. Table 2 shows conditions of manufacturing the transparent conductive film. Here, in Table 2, a temperature of the base body before film formation is 150° C.; however, when a transparent conductive film is formed on the surface of the base body by a DC sputtering method, a temperature of the base body increases due to heat input from plasma. Even in such case, as a result of controlling the temperature of the base body before film formation so that a temperature (° C.) of the base body during film formation (that is, a temperature of the a-Si film serving as a foundation of the transparent conductive film) is in the range of 70 to 220, it is possible to obtain the effects of the invention.

EXAMPLES

Next, Examples will be described.

The transparent conductive films of Examples 1 to 13 which will be described below are formed on the a-Si film by use of the modified example 2 of the above-mentioned sputtering apparatus, that is, the transparent conductive films that are formed by carrying out sputtering while supplying water vapor ($H_2O$) from the water vapor ($H_2O$) supply ports A and E to the upstream side of the target.

TABLE 2

| TRANSPARENT CONDUCTIVE FILM (104.114) | FILM FORMATION METHOD | DC SPUTTERING METHOD |
|---|---|---|
| | TARGET | ITO($SnO_2$; 10% BY MASS) |
| | PROCESSING GAS | Ar, $O_2$, $H_2O$ |
| | PRESSURE DURING FILM FORMATION | 0.7(Pa) |
| | TEMPERATURE OF BASE BODY BEFORE FILM FORMATION | 150(° C.) |
| | FILM THICKNESS | 115(nm) |
| | CONDITIONS OF POST-HEAT TREATMENT | IN AIR, 200(° C.), 30(min) |

(Evaluation of Film Quality of Transparent Conductive Film)

Table 3 has been moved into a new figure named FIG. 21.

Hydrogen in a state of water vapor is added to argon and oxygen which serve as a processing gas under the conditions of manufacturing transparent conductive films which are shown in Table 2 (heating film formation: 150° C., before film formation substrate temperature). In this situation, the additive amounts of hydrogen under five conditions (0.0%, 2.0%, 4.0%, 6.0%, and 8.0%) which represent the partial pressure of water with respect to argon were studied.

Additionally, transparent conductive films were formed by film formation at a room temperature (25 to 30° C., before film formation substrate temperature). In this situation, the additive amounts of hydrogen under two conditions (0.0% and 2.0%) which represent the partial pressure of water with respect to argon were studied.

Hereinbelow, the condition in which an additive amount of hydrogen is 0.0% and film formation at a room temperature is carried out is referred to as Comparative Example 1, the condition in which an additive amount of hydrogen is 2.0% and film formation at a room temperature is carried out is referred to as Comparative Example 2, and the condition in which an additive amount of hydrogen is 0.0% and heating film formation is carried out is referred to as Comparative Example 3. Furthermore, the conditions of the additive amounts of hydrogen are 2.0%, 4.0%, 6.0%, and 8.0% in which heating film formation is carried out are referred to as Example 1, Example 2, Example 3, and Example 4 in this order.

The following points were clarified from Table 3.

(A1) Also in the film formation at a room temperature which is conventional technology, the hole mobility was increased due to introduction of the gas containing hydrogen as a processing gas; however, the carrier density was slightly decreased. As a result, it was observed that, as a degree of light absorption decreases due to free carrier, the absorptivity at a wavelength of 1150 nm decreases (comparison of the Comparative Example 1 and the Comparative Example 2).

(A2) In the heating film formation according to the embodiment of the invention, an increase in hole mobility (Arrow a in Table) and a reduction in carrier density (Arrow b in Table), due to introduction of the gas containing hydrogen as a processing gas, conspicuously appeared as compared with the case of film formation at a room temperature (comparison of the Comparative Example 3 and Example 1).

(A3) A tendency was observed that, as the additive amount of hydrogen increases, the resistance value (sheet resistance) increases (Arrow c in Table). Furthermore, when the partial pressure of water becomes larger than 6% (Example 4), since the sheet resistance exceeds 100Ω/□ (Arrow d in Table), a problem occurs in the function required for the transparent conductive film (Examples 1 to 4).

(A4) In the case where the partial pressure of water becomes larger than 6% (Example 4), it was observed that the hole mobility is precipitously reduced (Arrow e in Table) and the carrier density increases (Arrow f in Table) (comparison of Example 3 and Example 4). Consequently, it was determined that, the absorptivity at a wavelength of 1150 nm increases until being substantially the same as in the case where hydrogen is not added (Arrow g in Table) (comparison of the Comparative Example 3 and Example 4).

From the results described above, in order to achieve a low absorptivity in a near infrared region while maintaining electrical characteristics of the transparent conductive film which are required for a conductive film, it was found that satisfaction of three conditions (carrying out heating film formation, introduction of a gas containing hydrogen as a processing gas, and partial pressure of water is less than or equal to 6%) are of importance.

(Optical Evaluation of Substrate with Transparent Conductive Film)

Figure 6:
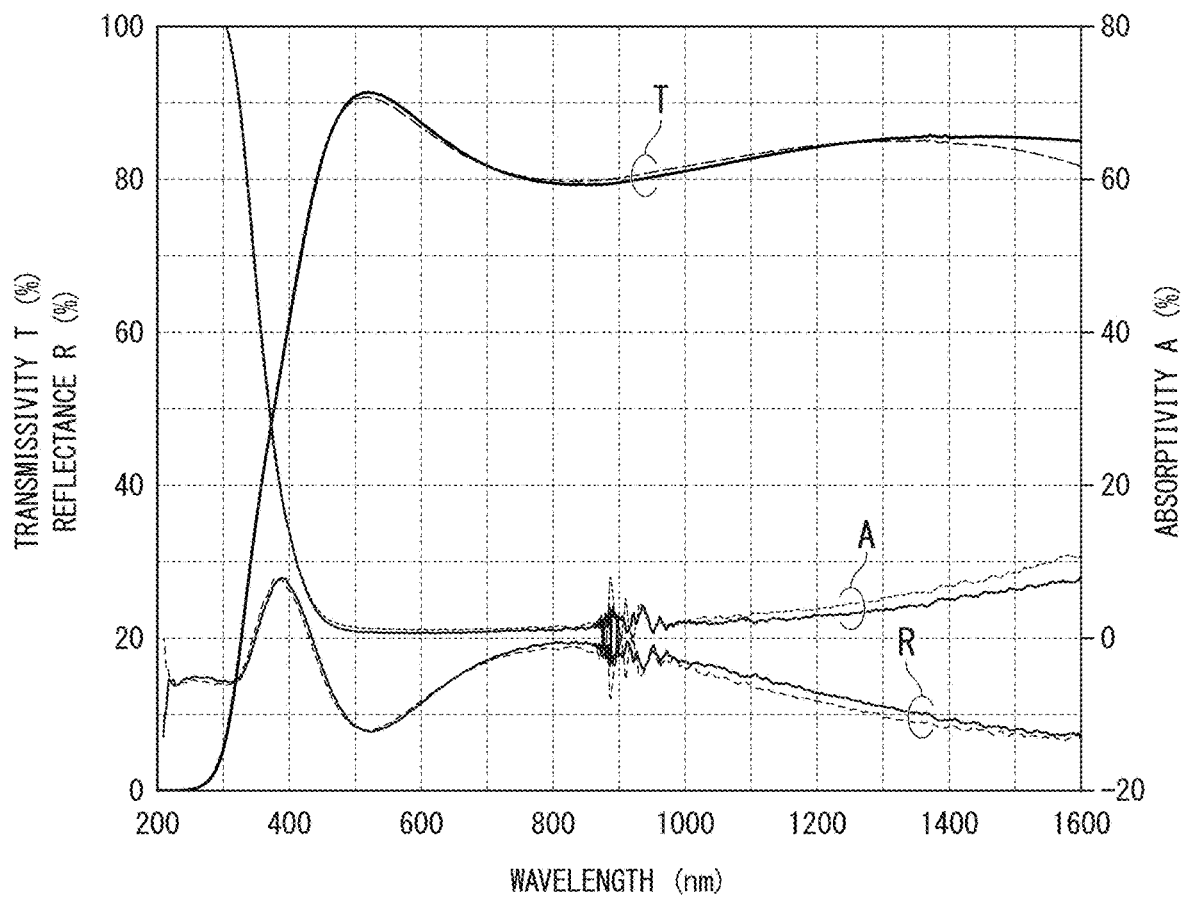
FIG. 6 is a chart showing optical characteristics (transmissivity, reflectance, and absorptivity) of the substrate with the transparent conductive film.

FIG. 6 is a chart showing optical characteristics (transmissivity, reflectance, and absorptivity) of the substrate with the transparent conductive film, the x-axis thereof represents a wavelength, and the y-axis thereof represents transmissivity (left side), reflectance (left side), and absorptivity (right side). The conditions of forming the substrate with the transparent conductive film are the same as the conditions shown in Tables 2 and 3.

In FIG. 6, regarding the sample (film formation at a room temperature, water addition of 2%) of the Comparative Example 2 and the sample of Example 2 (heating film formation, water addition of 4%) which are substantially the same as each other in sheet resistance value, the samples were compared with each other in terms of optical characteristics (transmissivity, reflectance, and absorptivity). In FIG. 6, a dotted line represents the sample of the Comparative Example 2, and a solid line represents the sample of Example 2.

The following points were clarified from FIG. 6.

(B1) When comparison is carried out in the case where sheet resistance values thereof are the same as each other which are an indicator of an electro-conductivity of the transparent conductive film, in the absorptivity at a wavelength of 1150 nm in Table 3, the Comparative Example 2 (the sample was film-formed at a room temperature) was 2.96% and Example 2 (the sample was film-formed by heating) was 0.99%. Accordingly, it was found that the absorptivity can be considerably reduced due to film formation by heating.

(B2) As shown in FIG. 6, the phenomenon that the absorptivity is reduced due to film formation by heating was observed substantially over an entire region in a near infrared wavelength region. It was found that, as a low absorptivity is achieved, the sample that is film-formed by heating becomes the transparent conductive film having a high transmissivity.

(B3) Also, it was found that the phenomenon (low absorptivity, high transmissivity) of the aforementioned (B2) has a tendency to become wider as a wavelength becomes wider region in a near infrared region. Accordingly, it was determined that the embodiment of the invention contributes to provision of the substrate with the transparent conductive film which is effective to light having a near infrared wavelength region.

It was apparent from FIG. 6 that, a transparent conductive film exhibiting a low absorptivity in a range of a visible range to a near infrared region is obtained by the manufacturing method according to the embodiment of the invention, that is, "a method of manufacturing a transparent conductive film on a heated a-Si film by a DC sputtering method using a processing gas containing hydrogen".

In contrast, it was determined that, in the case of forming the transparent conductive film only by argon and oxygen even where the a-Si film is heated to 150° C., the effect similar to the invention, that is, a low absorptivity in a near infrared region cannot be stably obtained.

Consequently, it was found that "a method of manufacturing a transparent conductive film on a heated a-Si film by a DC sputtering method using a processing gas containing hydrogen" is effective to stably manufacture a transparent conductive film exhibiting a low absorptivity in a range of a visible range to a near infrared region.

Note that, it was found that in order to obtain the above-mentioned "a decrease in absorptivity in a near infrared region due to addition of hydrogen is observed, and in accordance with this, there is a tendency that the transmissivity increases", it is preferable that a partial pressure of water be less than or equal to 6%. In the case of 8%, there was a tendency that, as a wavelength increases, the absorptivity increases (not shown in the figure).

Furthermore, in the manufacturing method according to the aforementioned embodiment of the invention, that is, "a method of manufacturing a transparent conductive film on a heated a-Si film by a DC sputtering method using a processing gas containing hydrogen", in the case of replacing the DC sputtering method with an RF sputtering method, even where the same input electric power is set, it was observed that a film-forming rate of the transparent conductive film becomes slow such as being approximately one-half. Accordingly, it was apparent that the manufacturing method according to the embodiment of the invention is a manufacturing method providing excellent mass productivity as compared with an RF sputtering method.

(Evaluation 1 of Crystallinity of Transparent Conductive Film)

Table 4 shows surface roughness (Ra) of a transparent conductive film of a substrate with a transparent conductive film and a hydrogen content of the transparent conductive film (concentration of hydrogen). Here, a hydrogen content of the transparent conductive film means a concentration of hydrogen at near the center in a thickness of the transparent conductive film.

In this situation, in conditions of forming the transparent conductive film, the additive amounts of hydrogen under six conditions (0.0%, 0.3%, 1.0%, 2.0%, 4.5%, and 6.0%) which represent the partial pressure of water with respect to argon were studied.

Except for the conditions of the additive amount of hydrogen, the conditions of forming the transparent conductive film are the same as the conditions shown in Tables 2 and 3 (heating film formation, that is, a temperature of the base body before film formation is 150° C.), and post-heat treatment of 200° C. for 30 minutes is carried out after film formation is completed. Note that, "--" in Table 4 means that a measurement value is absent. Additionally, "HYDROGEN CONTENT" in Table 4 means a representative value. The hydrogen content of the transparent conductive film will be particularly described with reference to FIGS. 15 to 19 which will be described later.

From the results described above, it was determined that, in order to obtain a transparent conductive film having a high degree of surface smoothness, the necessary condition is that a hydrogen content of the transparent conductive film (concentration of hydrogen (atoms/cm$^3$)) is greater than or equal to $1 \times 10^{21}$.

(D1) The tendencies (C1) to (C3) that were described above, that is, the relationship between the transparent conductive film having a high degree of surface smoothness and the hydrogen content of the transparent conductive film are also apparent from the photographs shown in FIGS. 9A to 14 (crystal structures of the transparent conductive film shown in SEM images) which will be described later.

(D2) In the case of not using a gas containing hydrogen as a processing gas (FIGS. 9A and 9B), it was observed that a crystal of the transparent conductive film is formed in a pillar shape in a cross-sectional view of SEM. In contrast, only when an extremely small amount of water was added to a processing gas (FIGS. 10A and 10B), a pillar-shaped crystal was not observed. In the case where the additive amount of hydrogen is within the range of 0.3% to 6.0%, a pillar-shaped crystal is not observed (FIGS. 10A to 12B).

(D3) It is conceivable that, the reason that the aforementioned phenomenon (the pillar-shaped crystal disappears due to addition of hydrogen) of (D2) occurs is that the transparent conductive film becomes amorphous by use of a processing gas containing hydrogen.

(D4) As a result of the disappearance of the pillar-shaped crystal, the smoothness of the surface of the transparent conductive film is improved, and therefore the value of the surface roughness Ra that is less than or equal to 1 nm was obtained. In the case where the additive amount of hydrogen is within the range of 0.3% to 6.0%, Ra was less than or equal to 1 nm (Table 4).

(D5) It was observed that the case where a texture is provided on a surface of a silicon substrate (FIGS. 13 and 14) is also the same as the aforementioned tendencies (D1) to (D4).

TABLE 4

| ITEMS | COMPARATIVE EXAMPLE 4 | EXAMPLE 5 | EXAMPLE 6 | EXAMPLE 7 | EXAMPLE 8 | EXAMPLE 9 |
|---|---|---|---|---|---|---|
| H$_2$O/Ar (%) | 0.0 | 0.3 | 1.0 | 2.0 | 4.5 | 6.0 |
| SURFACE ROUGHNESS (Ra) (nm) | 2.11 | 0.85 | 0.54 | 0.51 | 0.29 | 0.26 |
| HYDROGEN CONTENT (atoms/cm$^3$) | $4.81 \times 10^{20}$ | $2.15 \times 10^{21}$ | — | $4.06 \times 10^{21}$ | — | $7.03 \times 10^{21}$ |

The following points were clarified from Table 4.

(C1) The values of the surface roughness of the transparent conductive films that are subjected to film formation by heating and are manufactured by use of a gas containing hydrogen as a processing gas (Examples 5 to 9) was less than or equal to 1 nm. In the case where a gas containing hydrogen is not used (Comparative Example 4), the surface roughness was 2.11 nm. Accordingly, it is found that surface smoothness of the transparent conductive film is improved by use of a gas containing hydrogen.

(C2) Regarding the hydrogen content of the transparent conductive film (concentration of hydrogen (atoms/cm$^3$)), the case of not using a gas containing hydrogen (Comparative Example 4) was $4.81 \times 10^{20}$, in contrast to this, the case of using a gas containing hydrogen (Examples 5, 7, and 9) was $10^{21}$ order ($2.15 \times 10^{21}$ to $7.03 \times 10^{21}$).

Also, from the results described above, it was found that, in order to obtain a transparent conductive film having a high degree of surface smoothness, the necessary condition is that a hydrogen content of the transparent conductive film (concentration of hydrogen (atoms/cm$^3$)) is greater than or equal to $1 \times 10^{21}$.

(Optical Evaluation 2)

FIGS. 9A to 12B are photographs of SEM images of transparent conductive films manufactured on a base body made of a glass substrate, and FIGS. 9A, 10A, 11A, and 12A are 150k magnification photographs showing cross-section of the transparent conductive films. FIGS. 9B, 10B, 11B, and 12B are 150k magnification photographs showing the top surfaces of the transparent conductive films.

Figure 9A:
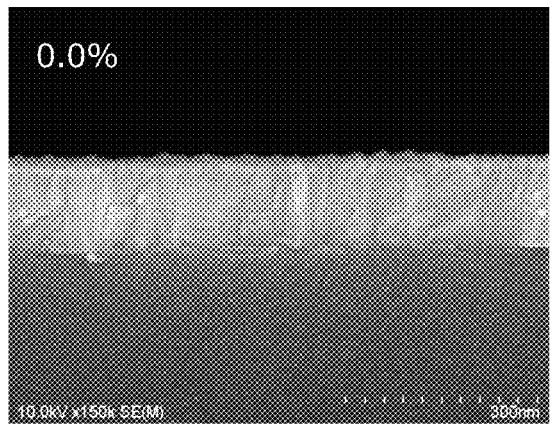
FIG. 9A is a view showing a SEM image (partial pressure of water is 0%) of a transparent conductive film and is a photograph of a cross-sectional surface of the transparent conductive film.
Figure 9B:
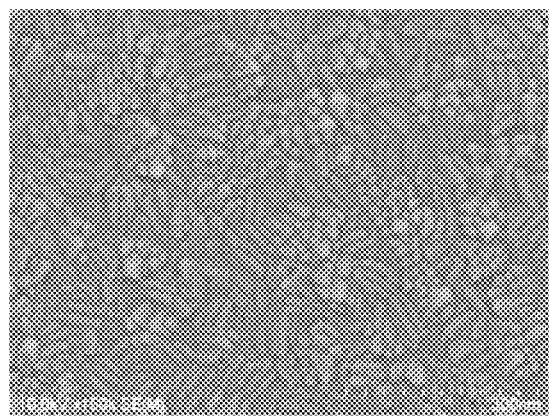
FIG. 9B is a view showing a SEM image (partial pressure of water is 0%) of a transparent conductive film and is a photograph of a top surface of the transparent conductive film.
Figure 10A:
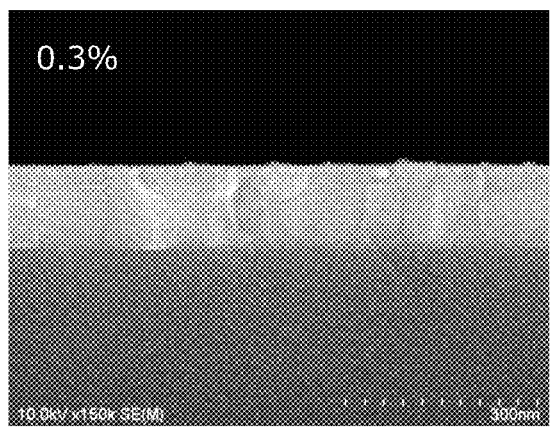
FIG. 10A is a view showing a SEM image (partial pressure of water is 0.3%) of a transparent conductive film and is a photograph of a cross-sectional surface of the transparent conductive film.
Figure 10B:
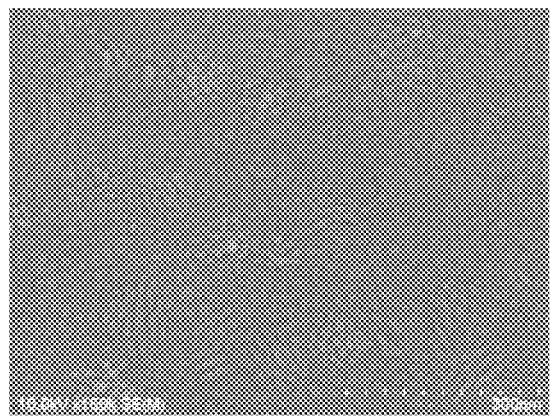
FIG. 10B is a view showing a SEM image (partial pressure of water is 0.3%) of a transparent conductive film and is a photograph of a top surface of the transparent conductive film.
Figure 11A:
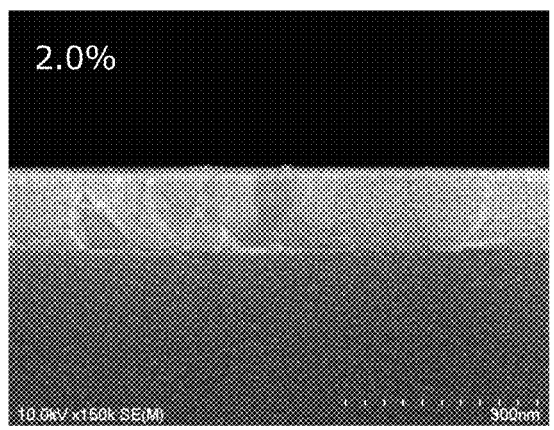
FIG. 11A is a view showing a SEM image (partial pressure of water is 2%) of a transparent conductive film and is a photograph of a cross-sectional surface of the transparent conductive film.
Figure 11B:
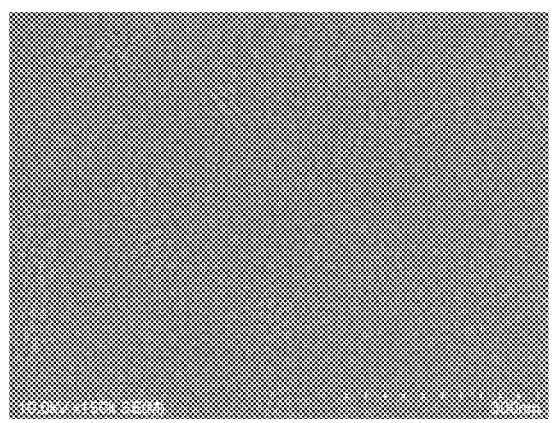
FIG. 11B is a view showing a SEM image (partial pressure of water is 2%) of a transparent conductive film and is a photograph of a top surface of the transparent conductive film.
Figure 12A:
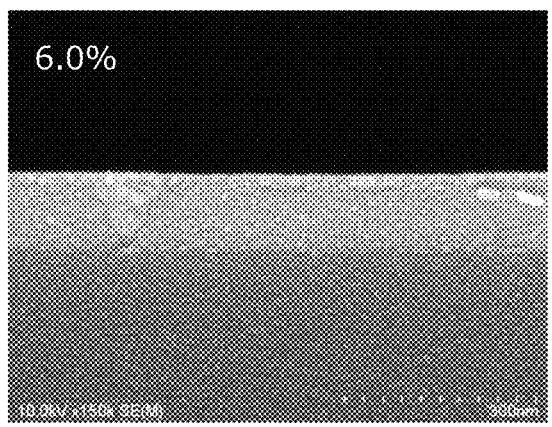
FIG. 12A is a view showing a SEM image (partial pressure of water is 6%) of a transparent conductive film and is a photograph of a cross-sectional surface of the transparent conductive film.
Figure 12B:
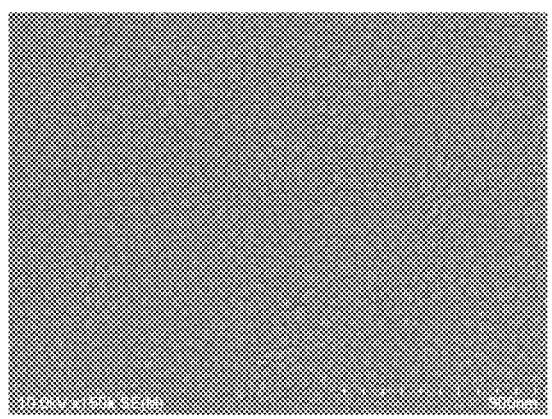
FIG. 12B is a view showing a SEM image (partial pressure of water is 6%) of a transparent conductive film and is a photograph of a top surface of the transparent conductive film.

FIGS. 9A and 9B show the case where an additive amount of hydrogen is 0.0% which represents the partial pressure of water with respect to argon. FIGS. 10A and 10B show the case where an additive amount of hydrogen is 0.3% which represents the partial pressure of water with respect to argon. FIG. 11A and FIG. 11B show the case where the additive amount of hydrogen is 2.0% which represents the partial pressure of water with respect to argon. FIG. 12A and FIG. 12B show the case where an additive amount of hydrogen is 6.0% which represents the partial pressure of water with respect to argon.

Except for the conditions of the additive amount of hydrogen, the conditions of forming the transparent conductive film shown in FIGS. 9A to 12B are the same as the conditions shown in Tables 2 and 3 (heating film formation, that is, a temperature of the base body before film formation is 150° C.), and post-heat treatment of 200° C. for 30 minutes is carried out after film formation is completed.

Figure 13:
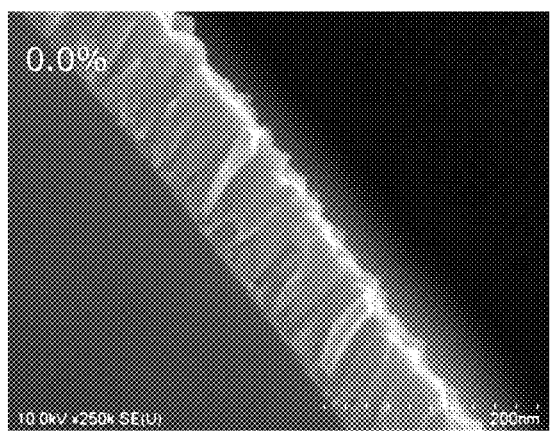
FIG. 13 is a photograph of a SEM image (partial pressure of water is 0%) of a transparent conductive film.
Figure 14:
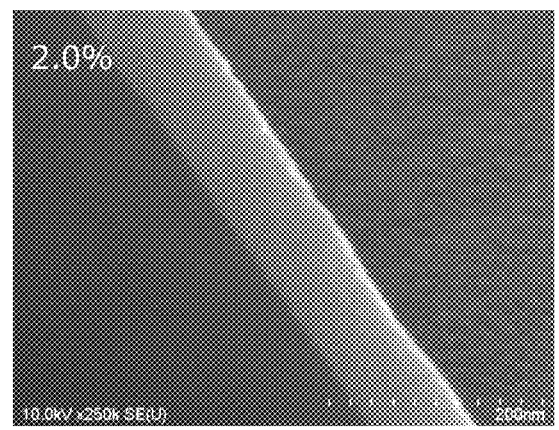
FIG. 14 is a photograph of a SEM image (partial pressure of water is 2%) of a transparent conductive film.

FIGS. 13 and 14 are photographs of SEM images of transparent conductive films manufactured on the base body made of a silicon substrate, and both are 250k magnification photographs showing cross-section thereof. FIG. 13 shows a case where an additive amount of hydrogen is 0.0% which represents the partial pressure of water with respect to argon. FIG. 14 shows a case where an additive amount of hydrogen is 2.0% which represents the partial pressure of water with respect to argon. Except for the conditions of the additive amount of hydrogen, the conditions of forming the transparent conductive film shown in FIGS. 13 and 14 are the same as the conditions shown in Tables 2 and 3 (heating film formation, that is, the temperature of the base body before film formation is 150° C.), and post-heat treatment of 200° C. for 30 minutes is carried out after film formation is completed.

The following points were clarified from the photographs shown in FIGS. 9A to 14.

(E1) In the case where water is absent (FIGS. 9A and 9B), that is, in the case where a gas containing hydrogen as a processing gas is not used (an additive amount of hydrogen is 0.0%) (Comparative Example 4: FIGS. 9A and 9B), fine crystal grains were observed on the top surface of the transparent conductive film. As apparent from the cross-section photographs, it was observed that each crystal grain is formed in a pillar shape and an irregularity shape corresponding to this pillar shape is reflected on the top surface of the transparent conductive film. In FIGS. 9A and 9B, a surface roughness Ra of the transparent conductive film was 2.11 nm.

(E2) In the case where a proportion of the gas containing hydrogen to the processing gas is 0.3% (Example 5: FIGS. 10A and 10B), the transparent conductive film is formed in a state of being amorphous, and crystals in a state of being pillar-shaped were not observed from the cross-section photographs. In accordance with this, it was observed that the top surface of the transparent conductive film is flat. In FIGS. 10A and 10B, a surface roughness Ra of the transparent conductive film was 0.85 nm.

(E3) In the case where a proportion of the gas containing hydrogen to the processing gas is 2% and 6% (Example 7: FIGS. 11A and 11B, Example 9: FIGS. 12A and 12B), amorphization further progresses in the transparent conductive film, and crystals in a state of being pillar-shaped were not observed from the cross-section photographs. In accordance with this, it was observed that flatness of the top surface of the transparent conductive film is further improved. In FIGS. 11A to 12B, surface roughnesses Ra of the transparent conductive films were 0.51 nm (Example 7) and 0.29 nm (Example 9).

(E4) Even in the case where a base body forming the transparent conductive film is made of a silicon substrate (FIGS. 13 and 14), similar to the case where the base body is made of a glass substrate (FIGS. 10A to 12B), it is found that the effects of (E2) and (E3) are obtained.

The above-mentioned effects of (E2) and (E3) were observed in the case where the hydrogen content of the transparent conductive film (atoms/cm$^3$) is greater than or equal to $10^{21}$ order ($2.15 \times 10^{21}$) or more. In this situation, crystals in a state of being pillar-shaped were not observed in the transparent conductive film. Accordingly, the transparent conductive film had a flat surface profile, improvement in electrical contact between the structure that was in contact with the transparent conductive film and the transparent conductive film was achieved.

Consequently, the method of manufacturing the substrate with the transparent conductive film and the substrate with the transparent conductive film according to the embodiment of the invention have an excellent function in a wide range of a visible range to a near infrared region and contributes to realizing a solar cell, various light-receiving-emitting photodetectors, display panel, or the like, in which electrical contact between the structure that is in contact with the transparent conductive film and the transparent conductive film is improved.

(Profile of Hydrogen Content)

Profiles of a hydrogen content of transparent conductive films of the Comparative Examples and Examples which are shown in Table 4 will be described with reference to FIGS. 15 to 19. FIGS. 15 to 19 show results obtained by the SIMS analyzation.

The measuring instrument used for the SIMS analyzation is SIMS6650 produced by ULVAC-PHI, INCORPORATED. As measurement conditions, a first ion species was Cs$^+$, and acceleration voltage was 5 kV.

Figure 15:
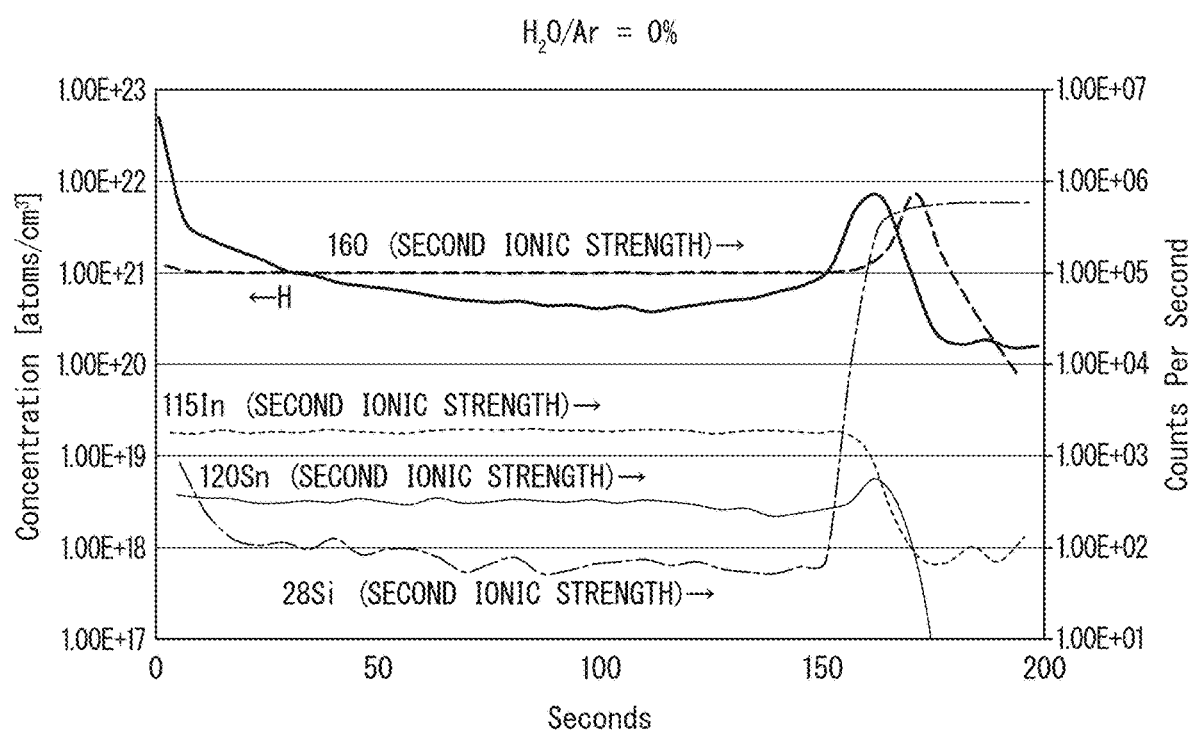
FIG. 15 is a view showing a profile of a hydrogen content of a transparent conductive film of Comparative Example 4.

FIG. 15 shows a profile of a hydrogen content of a transparent conductive film of the Comparative Example 4 (in the case where H$_2$O/Ar is 0%).

Figure 16:
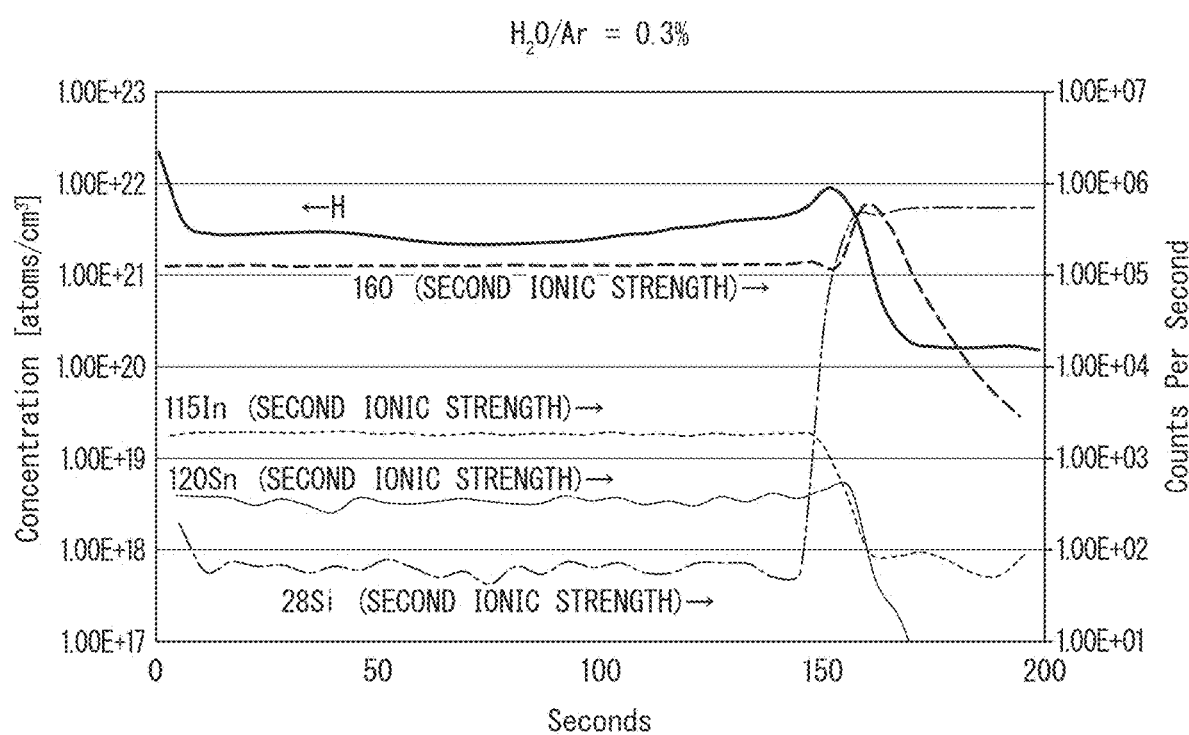
FIG. 16 is a view showing a profile of a hydrogen content of a transparent conductive film of Example 5.

FIG. 16 shows a profile of a hydrogen content of a transparent conductive film of Example 5 (in the case where H$_2$O/Ar is 0.3%).

Figure 17:
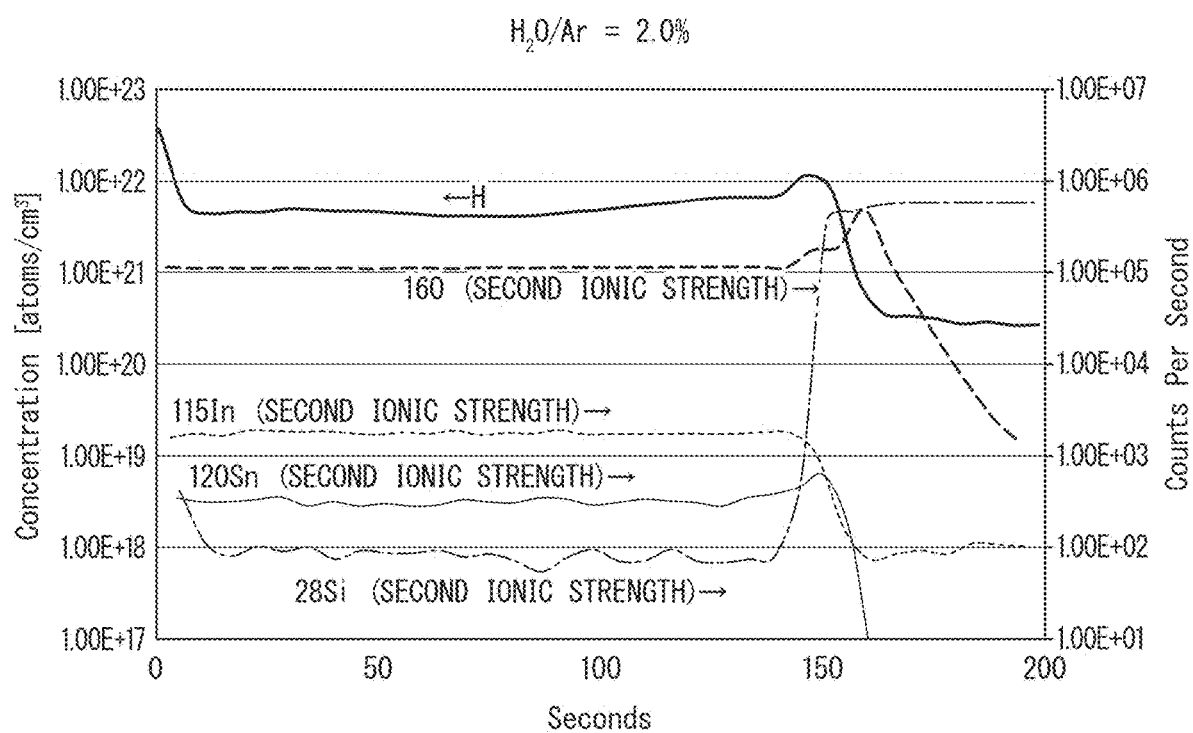
FIG. 17 is a view showing a profile of a hydrogen content of a transparent conductive film of Example 7.

FIG. 17 shows a profile of a hydrogen content of a transparent conductive film of Example 7 (in the case where H$_2$O/Ar is 2.0%).

Figure 18:
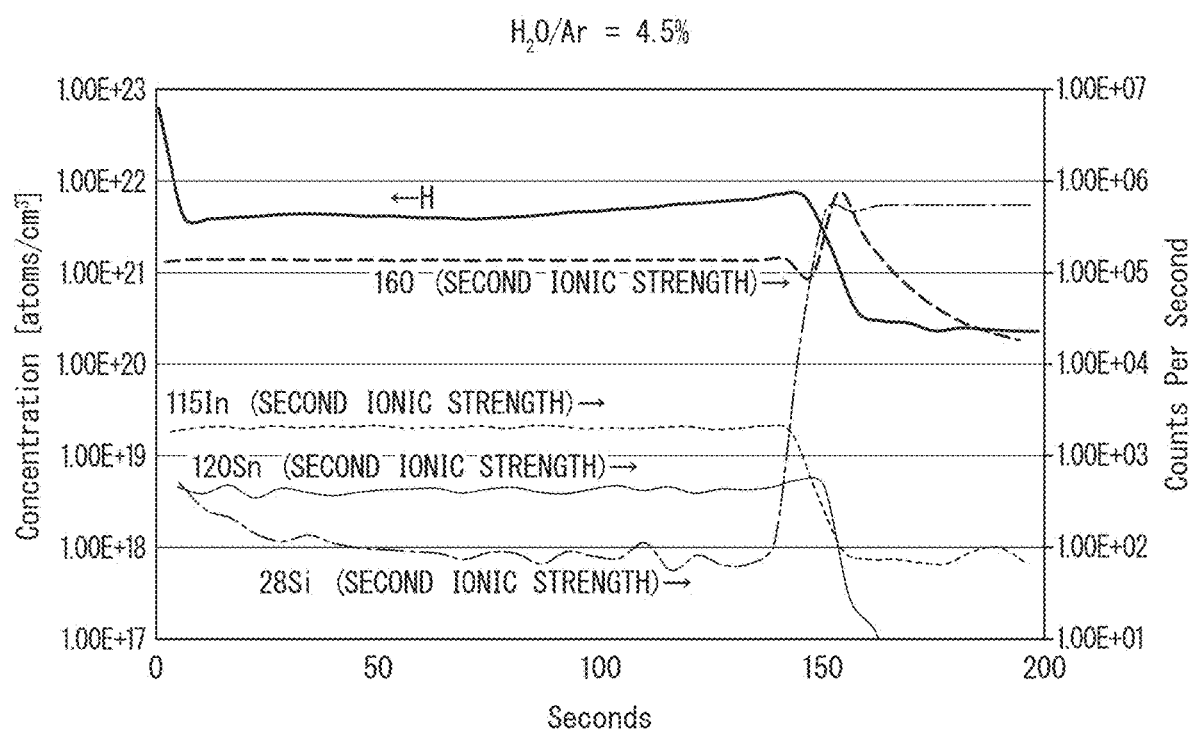
FIG. 18 is a view showing a profile of a hydrogen content of a transparent conductive film of Example 8.

FIG. 18 shows a profile of a hydrogen content of a transparent conductive film of Example 8 (in the case where H$_2$O/Ar is 4.5%).

Figure 19:
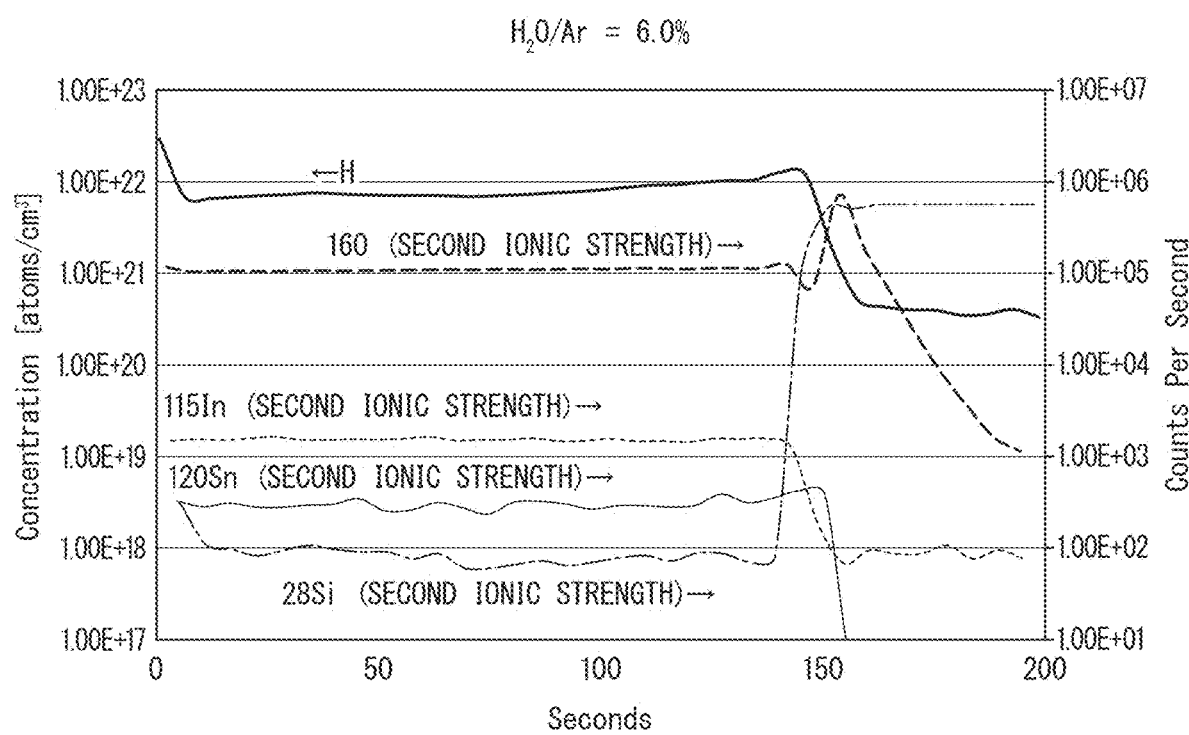
FIG. 19 is a view showing a profile of a hydrogen content of a transparent conductive film of Example 9.
Figure 20:
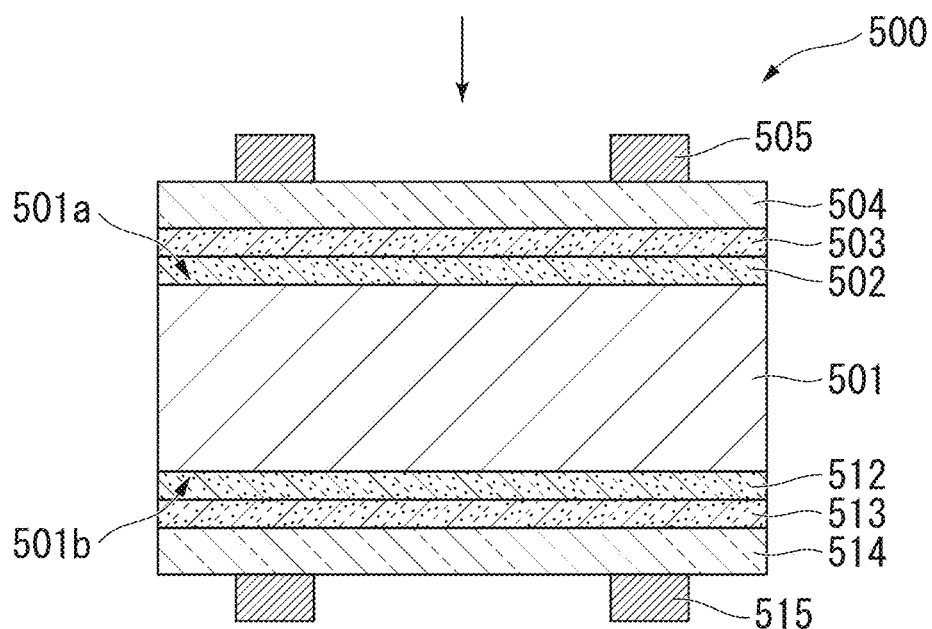
FIG. 20 is a cross-sectional view showing an example of a solar cell including a substrate with a conventional transparent conductive film.

FIG. 19 shows a profile of a hydrogen content of a transparent conductive film of Example 9 (in a state where H$_2$O/Ar is 6.0%).

In each of FIGS. 15 to 19, the x-axis represents a depth of the transparent conductive film (an amount of time of digging the transparent conductive film from the top surface of the transparent conductive film (outer side)), the left y-axis represents a hydrogen content (atoms/cm$^3$), and the right y-axis represents second ionic strengths of 16O, 115In, 120Sn, and 28Si. In each of FIGS. 15 to 19, a solid line represents a hydrogen content.

In each of FIGS. 15 to 19, the numerical values indicated on the right and left/y-axes represent the order, that is, the numerical values of 1.00E+17 to 1.00E+23 which are indicated on the left y-axis mean $1 \times 10^{17}$ to $1 \times 10^{23}$, and the numerical values of 1.00E+01 to 1.00E+07 which are indicated on the right y-axis mean $1 \times 10^1$ to $1 \times 10^7$.

The following points were clarified from FIGS. 15 to 19.

(F1) In the case of the Comparative Example 4, a hydrogen content of the transparent conductive film was $10^{20}$ (atoms/ cm$^3$) order. Note that, a hydrogen content sharply increases near the boundary face (approximately 150 seconds) between the a-Si film and the transparent conductive film; however, this means the effect of noise which is received from the boundary face, it is not necessary to consider this.
(F2) In the case of the Comparative Example 4, it was apparent that, the hydrogen content of the initial layer of the transparent conductive film, that is, of the position close to the boundary face between the transparent conductive film and the a-Si film is lower than that of Examples 5, 7, 8, and 9 which will be described later.
(F3) In the case of Examples 5, 7, 8, and 9, the hydrogen content of the transparent conductive film was greater than or equal to $10^{21}$ (atoms/cm$^3$) order.
(F4) In the case of Examples 5, 7, 8, and 9, it was apparent that, the hydrogen content of the initial layer of the transparent conductive film, that is, of the position close to the boundary face between the transparent conductive film and the a-Si film is higher than that of the Comparative Example 4. Particularly, a result was obtained in which the hydrogen content is high at the position close to the boundary face between the transparent conductive film and the a-Si film. It is conceivable that this is because the hydrogen content increases by supplying water vapor (H$_2$O) to the upstream side of the target.
(F5) In the case of Examples 5, 7, 8, and 9, it was apparent that, as the transparent conductive film grows, the hydrogen content gradually decreases. That is, it was apparent that a hydrogen content of the transparent conductive film decreases in a direction from the boundary face between the transparent conductive film and the a-Si film to the outside of the transparent conductive film.

Note that, in the case of Examples 8 and 9, the result was obtained in which the second ionic strength of 160 decreases at the position close to the boundary face between the transparent conductive film and the a-Si film and an oxygen reduction region occurs. On the other hand, in the Comparative Example 4 and Examples 5 and 7, the result was not obtained such that the second ionic strength of 160 decreases at the position close to the boundary face.
(Profile of Hydrogen Content of Transparent Conductive Film)

Profiles of a hydrogen content of transparent conductive films of the Comparative Examples and Examples which are shown in Table 5 will be described.

Regarding "H$_2$O/Ar" shown in Table 5, 0(%) represents the Comparative Example 4, 0.3(%) represents Example 5, 2(%) represents Example 7, 4.5(%) represents Example 8, and 6(%) represents Example 9. "MAX" is the maximum value of the hydrogen content, "MIN" is the minimum value of the hydrogen content, "Ave" is the average value of the hydrogen content, and "UNI" represents the value of "(MAX−MIN)/(MAX+MIN)" that means uniformity.

TABLE 5

<PROFILE OF HYDROGEN CONTENT IN ITO>

| H$_2$O/Ar (%) | MAX (at./cm$^3$) | MIN (at./cm$^3$) | Ave (at./cm$^3$) | (MAX − MIN)/(MAX + MIN) UNI (%) |
|---|---|---|---|---|
| 0 | 2.4E+21 | 3.8E+20 | 7.6E+20 | 72.4 |
| 0.3 | 5.3E+21 | 2.1E+21 | 3.0E+21 | 42.7 |
| 2 | 7.0E+21 | 4.1E+21 | 5.0E+21 | 26.7 |
| 4.5 | 7.2E+21 | 3.8E+21 | 4.7E+21 | 30.1 |
| 6 | 1.3E+22 | 6.6E+21 | 8.1E+21 | 31.5 |

The following points were clarified from Table 5.
(G1) In the case where H$_2$O/Ar is 0%, it was apparent that the maximum value, the minimum value, and the average value of the hydrogen content are the lowest.
(G2) It was apparent that, as the value of H$_2$O/Ar increases, the maximum value, the minimum value, and the average value of the hydrogen content also increases. Particularly, in the case where H$_2$O/Ar is 6%, it was apparent that the maximum value, the minimum value, and the average value of the hydrogen content are the highest.
(G3) Regarding the uniformity "UNI", in the case where H$_2$O/Ar is 0%, it was apparent that the value thereof increases. Additionally, due to an increase in the value of H$_2$O/Ar, the uniformity becomes lower than that of the case where H$_2$O/Ar is 0%. In particular, it was apparent that, the uniformity in the case where H$_2$O/Ar is 2% is most excellent, and the case where H$_2$O/Ar is 4.5% and 6% does not obtain excellent uniformity more than the case of 2%. Consequently, in order to achieve both excellent uniformity and an increase in hydrogen content, it is preferable that H$_2$O/Ar be 2%.

Particularly, in order to obtain a high degree of film quality of the transparent conductive film, it is preferable to add hydrogen to the transparent conductive film so that the hydrogen content becomes uniform inside the film. For example, it is preferable that a concentration of hydrogen profile inside the film be less than or equal to 50%. Additionally, since a film quality of the transparent conductive film formed by a sputtering method significantly receives the effect of the initial layer, it is more preferable to form the transparent conductive film by a sputtering method so that a concentration of hydrogen of the initial layer becomes higher in a film thickness direction.
(Evaluation of Characteristics of Photovoltaic Cell)

Table 6 shows the cell characteristics of a solar cell including a substrate with a transparent conductive film which are the results evaluated by use of samples having the layered structure shown in FIG. 1.

In each sample of Table 6, an a-Si film is formed on a silicon substrate, and as the transparent conductive film, a transparent conductive film having a film thickness of 115 (nm) is provided thereon under the conditions for film formation shown in Table 2.

As conditions of heating a base body (that is, a-Si film) when the transparent conductive film is formed, the case of a room temperature (Comparative Example 5) and the case of 150° C. (Examples 10 to 13) are carried out, and a gas containing hydrogen is used as a processing gas for each condition. Additive amounts of hydrogen are shown in Table 6.

Here, the value of each evaluation item in the case of forming the transparent conductive film at a room temperature and setting the additive amount of hydrogen to 2.0% which represents the partial pressure of water (Comparative Example 5) is defined as 100, and the value of each evaluation item in the case of heat-forming the transparent conductive film (Examples 10 to 13) is normalized with respect thereto.

Evaluation items the cell characteristics of the solar cell are an open voltage, a short-circuit current, a fill factor, and a conversion efficiency.

TABLE 6

| ITEMS | COMPARATIVE EXAMPLE 5 | EXAMPLE 10 | EXAMPLE 11 | EXAMPLE 12 | EXAMPLE 13 |
|---|---|---|---|---|---|
| TEMPERATURE BEFORE FILM FORMATION (° C.) | 25 TO 30 (ROOM TEMPERATURE) | | 150 | | |
| $H_2O/Ar$ (%) | 2.0 | 1.5 | 3.0 | 4.5 | 6.0 |
| OPEN VOLTAGE (%) | 100.0 | 102.4 | 102.4 | 102.4 | 102.4 |
| SHORT-CIRCUIT CURRENT (%) | 100.0 | 99.4 | 100.0 | 100.1 | 100.2 |
| FILL FACTOR (%) | 100.0 | 101.7 | 101.1 | 100.1 | 100.0 |
| CONVERSION EFFICIENCY (%) | 100.0 | 103.4 | 103.5 | 102.5 | 102.5 |

The following points were clarified from Table 6.

(H1) Each of samples subjected to the heating film formation (150° C.) (Examples 10 to 13) is higher in open voltage than the sample subjected to the film formation at a room temperature (Comparative Example 5).

(H2) It is known that reduction in open voltage is caused by reduction in passivation effect of the a-Si film. Since the samples subjected to the heating film formation are higher in open voltage than the sample subjected to the film formation at a room temperature, it was found that a degree of incorporation of water into the a-Si film forming a foundation of the transparent conductive film is reduced by carrying out the heating film formation and the a-Si film is inhibited from being degraded.

(H3) The actions and the effects of the above-mentioned (H2) contribute to improvement in power generation. This means that, it was found that the samples subjected to the heating film formation is basically higher in short-circuit current and fill factor, and as a result, a solar cell having high conversion efficiency is obtained.

(H4) It is conceivable that improvement in short-circuit current is caused by the results of low absorptivity.

(H5) It is conceivable that improvement in fill factor is caused by: improvement in electrical contact between an electrode formed on the transparent conductive film and the transparent conductive film due to achievement of improvement in surface flatness of the transparent conductive film; and lowering of the resistance of the transparent conductive film.

From the results shown in Table 6, in the manufacturing method according to the embodiment of the invention, that is, "a method of manufacturing a transparent conductive film on a heated a-Si film by a DC sputtering method using a processing gas containing hydrogen", a degree of incorporation of water into the a-Si film serving as a foundation of the transparent conductive film is reduced, and it is possible to inhibit the a-Si film from being degraded. Because of this, the solar cell can provide the transparent conductive film that exhibits a low absorptivity in a range of a visible range to a near infrared region in addition to improving the characteristics required for a solar cell. As a result, it was apparent that a solar cell is obtained which an effectively utilize near-infrared light in addition to visible light for power generation.

In contrast, in the case of forming the transparent conductive film on the a-Si film at a room temperature by use of the processing gas containing hydrogen without heating the a-Si film, it is thought that the a-Si film is degraded due to incorporation of water into the a-Si film serving as a foundation of the transparent conductive film, and therefore a low absorptivity in an infrared region cannot be obtained in addition to that the characteristics required for a solar cell is degraded. Therefore, the solar cell including the transparent conductive film manufactured under these conditions is difficult to effectively utilize near-infrared light in addition to visible light for power generation.

Consequently, a solar cell including a transparent conductive film exhibiting a low absorptivity in a range of a visible range to a near infrared region can also effectively utilize light having a wavelength of a near infrared region. Therefore, the manufacturing method according to the embodiment of the invention contributes to provision of a solar cell that has power generation efficiency higher than in a conventional case.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, in the above-mentioned embodiment, the a-Si films are formed on both the top surface 101a and the back surface 101b of the base body 101; however, an a-Si film may be formed on at least one of the top surface 101a and the back surface 101b.

In addition, the first film formation chamber 754 and the second film formation chamber 755 may include the water vapor ($H_2O$) supply ports which are described in the modified examples 1 to 3 of the sputtering apparatuses, an oxygen ($O_2$) gas supply port, and an argon (Ar) gas supply port.

Note that, in the above-mentioned embodiment, a horizontal-transfer-type sputtering apparatus is described which includes a transfer mechanism that horizontally holds and transfers the base body 101. In consideration of incorporation of dusts into the transparent conductive film, the invention is also applicable to a vertical-transfer-type sputtering apparatus.

INDUSTRIAL APPLICABILITY

The present invention is widely applicable to a method of manufacturing a substrate with a transparent conductive film which exhibits a low absorptivity in a range of a visible range to a near infrared region and can be formed by high speed film formation; a manufacturing apparatus of a substrate with a transparent conductive film; a substrate with a transparent conductive film; and a solar cell.

DESCRIPTION OF REFERENCE NUMERALS 1, 1A, 2, 2A intermediate structure
10, 10A, 10C, 10D, 20, 20A substrate with transparent conductive film
100, 100A, 100B, 100C, 100D solar cell
101, 201 base body
101a, 201a top surface (surface)
101b, 201b back surface (surface)
102, 112, 202 i-type a-Si film
103, 203, 313 p-type a-Si film
104, 114, 204, TCO1, TCO2 transparent conductive film
105, 115 electrode
113, 303 n-type a-Si film
117 reflection film
200, 200A, 200B, 200C photodetector
205, 206 optical film
400 holder
401 holder body
402 protruding portion
403 end face
404 opening
700 sputtering apparatus (manufacturing apparatus)
750 transfer mechanism
751 load chamber (L)
751P, 752P exhaust device
752 heating chamber (H)
752H heater
753 film-formation entrance chamber (EN)
753H heater
754 first film formation chamber (S1)
754A first sputtering chamber
754B second sputtering chamber
754C2, 755C1, C1A, C1B, C1C, C1D, C2A, C2B, C2C, C2D cathode
754E2 power supply
754G, 755G processing gas introduction mechanism
754T2, 755T1, T1A, T1B, T1C, T1D, T2A, T2B, T2C, T2D target
754TC1, 755TC2, TC1A, TC1B, TC1C, TC1D, TC2A, TC2B, TC2C, TC2D temperature control device
755 second film formation chamber (S2)
755A third sputtering chamber
755B fourth sputtering chamber
755E1 power supply
756 film formation exit chamber (EX)
757 transfer chamber (T)
758 unload chamber (UL)
A, B, C, D, E, F, G, H water vapor (H$_2$O) supply port (processing gas introduction mechanism)
X non-film formation region

What is claimed is:

1. A manufacturing apparatus configured to deposit a transparent conductive film substrate on a solar cell, the manufacturing apparatus being an in-line sputtering apparatus, comprising:
a heating chamber configured to heat a substrate having a top surface, a back surface, and an a-Si film, both the top surface and the back surface of the substrate being coated with the a-Si film;
a first film formation chamber and a second film formation chamber, the first film formation chamber being next to the heating chamber, the first film formation chamber and the second film formation chamber each including a temperature control device and a target which are provided inside the respective film formation chambers, the first film formation chamber and the second film formation chamber each being connected to an exhaust device and a power supply, each temperature control device or target is only on top side or bottom side of each film formation chamber; the first film formation chamber being configured to form a transparent conductive film on the a-Si film provided on the back surface of the substrate, the second film formation chamber being configured to form a transparent conductive film on the a-Si film provided on the top surface of the substrate;
a film formation exit chamber that is next to the second film formation chamber and is different from the heating chamber;
a transfer mechanism configured to transfer the substrate in a forward transfer direction from the heating chamber to the film formation exit chamber through the first film formation chamber and the second film formation chamber, the transfer mechanism being configured to horizontally hold the substrate so that the substrate faces the target in the first film formation chamber and the second film formation chamber, the transfer mechanism being configured to transfer the substrate only in the forward transfer direction in the first film formation chamber and the second film formation chamber, the transfer mechanism being configured to cause the transparent conductive film to be formed on the a-Si film provided on both the top surface and the back surface of the substrate in the second film formation chamber and the first film formation chamber, respectively; and
a processing gas introduction mechanism configured to supply a processing gas to the first film formation chamber and the second film formation chamber, the processing gas introduction mechanism being configured to cause the first film formation chamber and the second film formation chamber to have a film formation space having the processing gas, the processing gas introduction mechanism being configured to supply the processing gas to an upstream side of the target in the forward transfer direction in each of the first film formation chamber and the second film formation chamber, the processing gas including one of the following:
water vapor (H2O) and argon (Ar) gas;
oxygen (O2), hydrogen (H2), and argon (Ar) gas;
oxygen (O2), hydrogen (H2), argon (Ar) gas, and water vapor (H2O);
water vapor (H2O), argon (Ar) gas, and oxygen (O2) gas; or
hydrogen (H2) introduced into a process atmosphere by causing water (H2O) to be adsorbed and absorbed to a peripheral member of the substrate,
wherein
the heating chamber sets temperatures of the substrate and the a-Si film in a range of 70 to 150° C. before forming the transparent conductive film on the a-Si film,
the power supply applies a sputtering voltage to the target,
DC sputtering of heating and forming the transparent conductive film is carried out in the first film formation chamber and the second film formation chamber while maintaining a temperature of the a-Si film to be in a range of 70 to 220° C., the transparent conductive film is thereby formed on the a-Si film provided on both the top surface and the back surface of the substrate while the substrate is transferred only in the forward transfer direction, and an amount of hydrogen contained in the transparent conductive film decreases in a direction from a boundary face between the transparent conductive film and the a-Si film provided on each of the top surface and the back surface of the substrate to an outer side of the transparent conductive film.

2. The manufacturing apparatus of a transparent conductive film substrate according to claim 1, wherein ⅔ or more of the film thickness of a film thickness of the transparent conductive film to be formed on the a-Si film is formed at a film-forming rate of 10 (nm·m/min) or more.

3. The manufacturing apparatus of a transparent conductive film substrate according to claim 1, wherein proportions of the water vapor and/or hydrogen in the processing gas are controlled in the first film formation chamber and the second film formation chamber so that an amount of hydrogen contained in the transparent conductive film is greater than or equal to $1\times10^{21}$ (atoms/cm$^3$) when the transparent conductive film is formed.

4. The manufacturing apparatus of a transparent conductive film substrate according to claim 1, further comprising:

a holder configured to support the substrate on which the a-Si film is formed, wherein the holder includes a holder body and a protruding portion that protrudes from the holder body and shields an outer-periphery of the a-Si film, and the transfer mechanism transfers the substrate supported by the holder to an inside of the first film formation chamber and the second film formation chamber.

* * * * *